US00RE33931E

United States Patent [19]

Whitney

[11] E Patent Number: Re. 33,931

[45] Reissued Date of Patent: May 19, 1992

[54] LASER PATTERN GENERATING SYSTEM

[75] Inventor: Theodore R. Whitney, Reseda, Calif.

[73] Assignee: American Semiconductor Equipment Technologies, Woodland Hills, Calif.

[21] Appl. No.: 75,175

[22] Filed: Jul. 20, 1987

Related U.S. Patent Documents

Reissue of:

[64] Patent No.: 4,541,712
Issued: Sep. 17, 1985
Appl. No.: 332,832
Filed: Dec. 21, 1981

[51] Int. Cl.[5] ..... G03B 27/42

[52] U.S. Cl. ..... 355/53; 355/46; 355/77; 354/4; 346/1.1; 358/302

[58] Field of Search ..... 355/53, 72, 77, 46; 350/358; 346/1.1; 354/4; 358/302

[56] References Cited

U.S. PATENT DOCUMENTS

| | | | |
|---|---|---|---|
| 3,632,205 | 1/1972 | Marcy | 355/53 |
| 3,732,796 | 5/1973 | Marcy | 354/4 |
| 3,797,935 | 3/1974 | Marcy | 355/53 |
| 3,925,785 | 12/1975 | Firtion et al. | 346/1 |
| 3,931,458 | 6/1976 | Dini | 178/6.6 B |
| 3,944,323 | 3/1976 | Starkweather | 358/302 |
| 3,973,825 | 8/1976 | Starkweather | 350/6 |
| 4,000,493 | 12/1976 | Spaulding et al. | 346/1.1 |
| 4,084,182 | 4/1978 | Maiman | 358/62 |
| 4,093,964 | 6/1978 | Aughton | 355/71 |
| 4,176,907 | 12/1979 | Matsumoto et al. | 350/6.8 |
| 4,201,455 | 5/1980 | Vadasz et al. | 350/358 |
| 4,209,240 | 6/1980 | Sutherland et al. | 354/4 |
| 4,321,564 | 3/1982 | Tregay | 350/358 |
| 4,344,677 | 8/1982 | Stuermer et al. | 354/5 |
| 4,370,678 | 1/1983 | Kitamura | 358/285 |
| 4,371,964 | 2/1983 | Podmaniczky et al. | 372/38 |
| 4,390,789 | 6/1983 | Smith et al. | 250/492.2 |
| 4,390,882 | 6/1983 | Ohara et al. | 346/1.1 |
| 4,395,721 | 7/1983 | Ohno et al. | 346/160 |
| 4,396,928 | 8/1983 | Abe et al. | 346/160 |
| 4,404,569 | 9/1983 | Neumann et al. | 354/4 |
| 4,419,675 | 12/1983 | Neumann et al. | 354/4 |
| 4,474,422 | 10/1984 | Kitamura . | |
| 4,504,726 | 3/1985 | Hosaka et al. | 219/121 LH |

FOREIGN PATENT DOCUMENTS

| | | |
|---|---|---|
| 7737908 | 12/1977 | France . |
| 54-143241 | 11/1979 | Japan . |
| 56-69610 | 6/1981 | Japan . |
| 56-127465 | 10/1981 | Japan . |

OTHER PUBLICATIONS

Sumi et al., "An Electron Beam Exposure System (VL-R1)", Japanese Journal of Applied Physics, vol. 18, Supplement 18-1 (1979), pp. 304-309.

Donahue, "Laser Pattern Generator for Printed Circuit Board Artwork Generation", SPIE, vol. 200, Laser Recording and Information Handling (1979), pp. 179-186.

(List continued on next page.)

*Primary Examiner*—Monroe H. Hayes
*Attorney, Agent, or Firm*—Skjerven, Morrill, MacPherson, Franklin & Friel

[57] ABSTRACT

In this laser pattern generator, plural laser beams are arranged in a closely spaced, noninterfering array. The beams are concurrently deflected across a region of the target surface by an acousto-optic deflector driven by a swept frequency drive signal. The target is moved perpendicular to the direction of deflection to reposition it for exposure during the next stroke of the beams. The extent of target offset in the direction of deflection is measured and used to control initiation of modulation during each deflection stroke, so that each portion of the generated pattern begins from a uniform reference line on the target. Pattern data is supplied to the beam modulators in accordance with data clock pulses the repetition rate of which is established by the rate of change of frequency of the deflector drive signal.

46 Claims, 9 Drawing Sheets

OTHER PUBLICATIONS

Toyen, "Generation of Precision Pixel Clock in Laser Printers and Scanners", SPIE, vol. 84, Laser Scanning Components & Techniques (1976), pp. 138–145.

Yew et al., "Electron Beam Lithography in the Production Line", IGC Conference, Massachusetts, Sep. 24–26, 1978.

Bardos, "Wideband Holographic Recorder", Applied Optics, vol. 13, No. 4, Apr. 1974, pp. 832–840.

Roberts et al., "High Speed Holographic Digital Recorder", Applied Optics, vol. 13, No. 4, Apr. 1974, pp. 841–856.

Chase et al., "Semiconductor Industry Trends and Their Impact on Optical Photolithography", IGC Conference, Holland, Sep. 10–12, 1980, pp. 1–86.

BLOCK START TRIGGER
96
ACOUSTO OPTIC DEFLECTION DRIVE ELECTRONICS
109
RAMP GENERATOR
118
REFERENCE OSCILLATOR
114
DATA CLOCK
110
VOLTAGE CONTROLLED OSCILLATOR
112
PHASE CLOCK
DELAY LINE
142
GATE
116
62
ACOUSTO OPTIC DEFLECTOR
28
106
COUNTER
100
MODULATION START GATE
$n(\frac{N}{2})d$
$t^*$
$t$
THIRD COMPARATOR
$(\Delta Y)=n(\frac{N}{2})D$
108
$\Delta Y$
FROM SUBTRACTOR-92

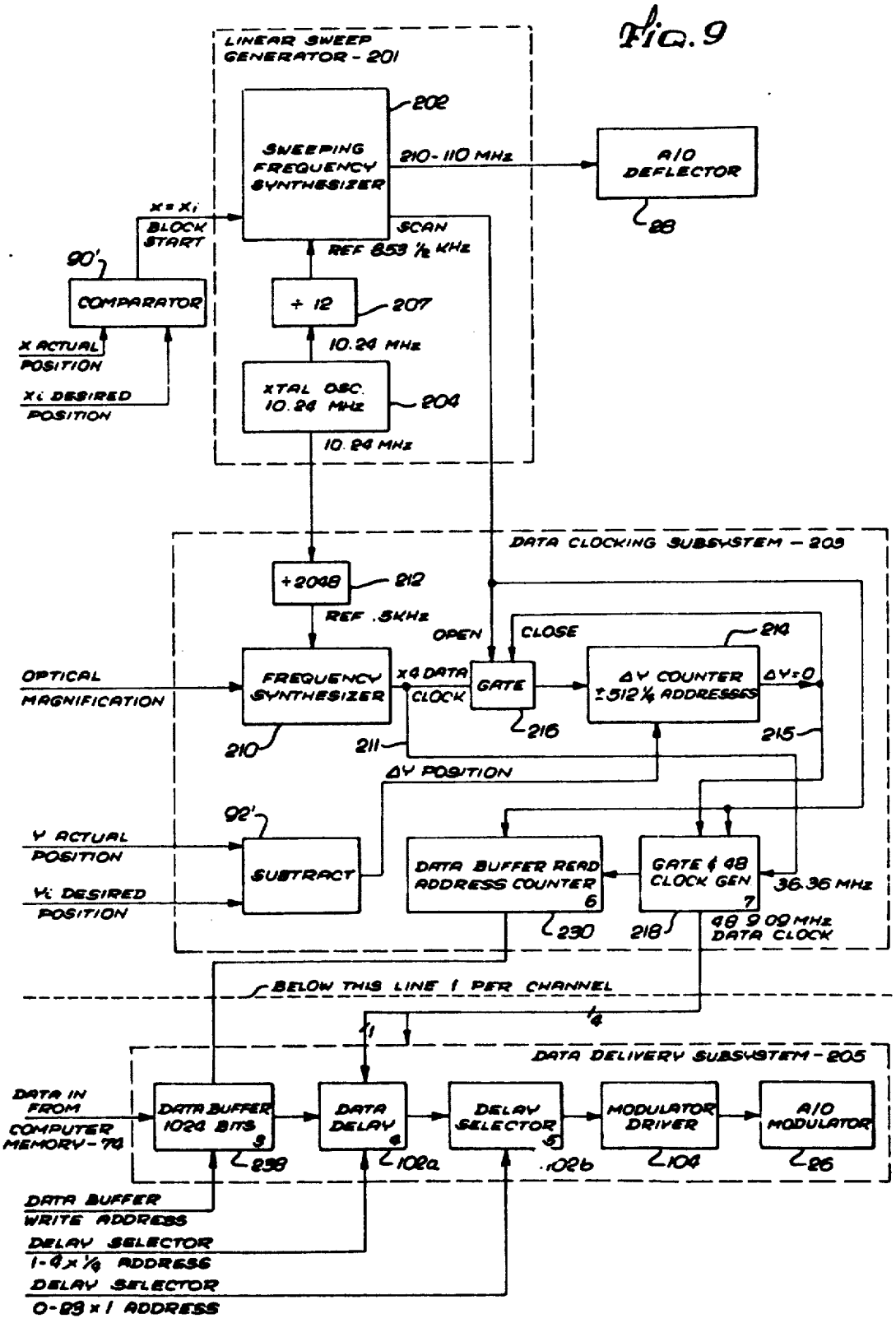
FIG. 9
LINEAR SWEEP GENERATOR - 201
SWEEPING FREQUENCY SYNTHESIZER
202
210-110 MHz
A/O DEFLECTOR
28
x = xi
BLOCK START
SCAN
REF 853 1/2 KHz
90'
COMPARATOR
÷ 12
207
10.24 MHz
X ACTUAL POSITION
Xi DESIRED POSITION
XTAL OSC. 10.24 MHz
204
10.24 MHz
DATA CLOCKING SUBSYSTEM - 209
÷2048
212
REF .5KHz
OPEN
CLOSE
214
OPTICAL MAGNIFICATION
FREQUENCY SYNTHESIZER
x4 DATA CLOCK
GATE
ΔY COUNTER ±512 1/4 ADDRESSES
ΔY=0
216
210
211
215
ΔY POSITION
92'
Y ACTUAL POSITION
Yi DESIRED POSITION
SUBTRACT
DATA BUFFER READ ADDRESS COUNTER 6
GATE & 48 CLOCK GEN 7
36.36 MHz
230
218
48 9.09 MHz DATA CLOCK
BELOW THIS LINE 1 PER CHANNEL
1
1/4
DATA DELIVERY SUBSYSTEM - 205
DATA IN FROM COMPUTER MEMORY - 74
DATA BUFFER 1024 BITS 3
DATA DELAY 4
DELAY SELECTOR 5
MODULATOR DRIVER
A/O MODULATOR
238
102a
102b
104
26
DATA BUFFER WRITE ADDRESS
DELAY SELECTOR 1-4 x 1/4 ADDRESS
DELAY SELECTOR 0-23 x 1 ADDRESS

LASER PATTERN GENERATING SYSTEM

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a system for generating integrated circuit patterns or the like on photomasks or semiconductor wafers coated with photoresist, using laser radiation. The invention uses plural laser beams in a coaligned, closely spaced noninterfering array. The beams are concurrently deflected across a region of the target surface by an acousto-optic deflector driven by a swept frequency drive signal. The target is moved perpendicular to such angular deflection to position it for exposure of the next adjacent portion of the pattern. The extent of target offset in the direction of deflection is measured and used to control the initiation of modulation during each deflection stroke so that each generated portion of the pattern begins from a uniform reference line on the target. Pattern data supplied to the beam modulators is timed by data clock pulses established by the rate of change of frequency of the deflector drive signal.

2. Description of the Prior Art

The production of an integrated circuit normally begins with a photomask, which is a photographic negative of a layer of the circuit. The photomask for the first layer of the integrated circuit is projected onto a wafer of silicon which is coated with a photosensitive material. The latent image of the circuit pattern for the first layer is then developed, and the silicon uncovered in this process is appropriately treated to change its electrical characteristics. The steps are repeated for each circuit layer using an appropriate photomask.

This microlithographic process was initially performed using contact printing, wherein the photomask was brought into physical contact with the wafer. Contact printing was later supplanted by one-to-one projection printing of the circuit onto the photoresist material. More recently, 10X reticles have been used. These reticles are photomasks of one layer of an integrated circuit pattern enlarged ten times and produced on a glass plate. A ten-to-one reduced image of this 10X reticle is projected onto the wafer to expose the photoresist according to the circuit pattern on the reticle. The use of 10X reticles reduces the effect of defects in the photomask and has enabled smaller patterns to be placed on the wafer then had previously been possible.

Usually the photomasks are produced by photographic reduction of hand or computer generated artwork that is many times larger than the article itself. More recent techniques for producing the photomasks and the 10X reticles include the use of a raster-scanned electron beam. The electron beam is selectively turned on and off during the raster-scan to generate the required pattern. The procedure is typically aided by a computer. Because of the substantial amount of information necessary to create a detailed integrated circuit pattern, this e-beam scanning procedure is time consuming and expensive.

Attempts have been made to use a single raster scanned laser beam to generate the integrated circuit pattern on the reticle. The achievable minimum circuit detail is comparable to that of an electron beam system. Scanning time is very substantial, making on-wafer pattern generation both time consuming and expensive. Moreover, it is difficult to maintain sweep linearity across the entire wafer or reticle, and equally or more difficult to maintain close parallel alignment of adjacent scan lines. For these reasons, a commercially practical single beam laser pattern generator has not been achieved in the past.

An objective of the present invention is to provide a laser pattern generator which overcomes these disadvantages. A further objective is to provide a laser pattern generator in which plural closely spaced, noninterfering beams are simultaneously deflected and modulated so as to accomplish pattern generation rapidly and with requisite beam positioning and modulation control so as to obtain very fine pattern resolution. The invention is usable both for reticle production and for direct on-wafer pattern generation.

SUMMARY OF THE INVENTION

The laser pattern generator of the present invention uses a laser and beam splitter optics to create a plurality of laser beams which are individually modulated with information concerning the integrated circuit pattern to be generated. Thereafter the beams are brought together so as to propagate in a closely spaced, noninterfering array. This array is optically processed, routed through an acousto-optic deflector, and brought to focus at the format or target surface. The format or target surface typically is a glass plate coated with photoresist in order to generate a photomask or reticle, or a silicon wafer coated with photoresist in order to allow an integrated circuit layer to be generated directly on the wafer.

The acousto-optic deflector used in the present invention deflects a significant portion of the energy in the laser beams through a range of angles, the angle of deflection depending upon the frequency of the signal used to drive the acousti-optic deflector. This signal is supplied by a voltage-controlled oscillator. In the present invention the driving signal is repetitively slewed over a range of frequencies so that the laser beams are deflected at a constantly changing angle. At the format or target surface this change is angular deflection appears as a scan or stroke of each focused laser beam along a line.

Only a portion of each scan or stroke is used to generate the integrated circuit pattern at the format; the laser beams are blanked out by the individual beam modulators during the beginning and end of the strokes. Blanking also occurs during the time that the the voltage controlled oscillator is being returned to its prestroke frequency after completion of a scan, while awaiting target repositioning prior to beginning another scan.

In the nominal plane of focus of the laser beams on the target surface, the direction perpendicular to the scan direction of the laser beams is designated the x-direction while the direction parallel to the scan is designated the y-direction. The target is mounted on a table movable with precision in these two directions and equipped with laser interferometers or other means for measuring, to within a fraction of a wavelength of light, the position of the table in the x- and y-directions.

At the format or target surface, the focused laser beams are spaced in the x-direction at adjacent addresses at which it is desired to generate integrated circuit information by modulating a laser beam on or off, so that during a single stroke of the acousto-optic deflector, a complete small block of pattern information is written as the beams scan in the y-direction on the photoresist. The table is moved in the x-direction so that during successive strokes contiguous blocks of pattern information are generated. After all contiguous blocks having their leading edges at the same y-address are completed, the table is moved in the y-direction and reverses its movement in the x-direction so that a second group or "swath" of contiguous blocks of pattern information adjacent to the first is generated. The procedure continues until the entire integrated circuit pattern has been written.

To compensate for y-axis "wandering" or offset error i.e., for small changes in the y-position of the table and target introduced as the table is moved in the x-direction, the position of the table in the y-direction is accurately measured before each stroke with a laser interferometer or other means. This information is used to delay or advance the start of modulation of the laser beams relative to the angular deflection of the beams.

The information necessary to modulate the plurality of laser beams in accordance with the desired integrated circuit pattern advantageously is stored in a computer memory. The data is made available to the individual beam modulators through respective data buffers. It is essential that the modulation signals occur at the proper angular deflections of the laser beams during the successive strokes so that the data will be accurately written onto the format. The angular deflection of the laser beams at any particular time during different strokes may vary due to variations in the starting frequency or the slew rate of the oscillator used to drive the acousto-optic deflector, or to variations in the index of refraction of the acousto-optic deflector medium which varies with temperature. In the present invention these effects are eliminated or compensated for through the design of the electronic components. Signals derived from the oscillator are used to provide the data clock for controlling the flow of data to the modulators so that notwithstanding any such variations, the laser beams are modulated to write the desired data at the proper positions in the y-direction during each stroke.

The novel features of the invention both as to its organization and its method of operation, together with further objectives and advantages thereof, will be better understood from the following description, considered in connection with the accompanying drawings, in which a presently preferred embodiment of the invention is described by way of example. It is expressly understood, however, that the drawings and description of the preferred embodiment are not intended as a definition of the limits of the invention.

BRIEF DESCRIPTION OF THE DRAWINGS

A detailed description of the invention will be made with reference to the accompanying drawings wherein like numerals designate corresponding parts in the several figures.

FIGS. 9, 10 and 11 are electrical block diagrams so alternative acousto-optic deflection drive and pattern modulation data supply circuitry for the laser pattern generator.

DESCRIPTION OF THE PREFERRED EMBODIMENT

Figure 1:
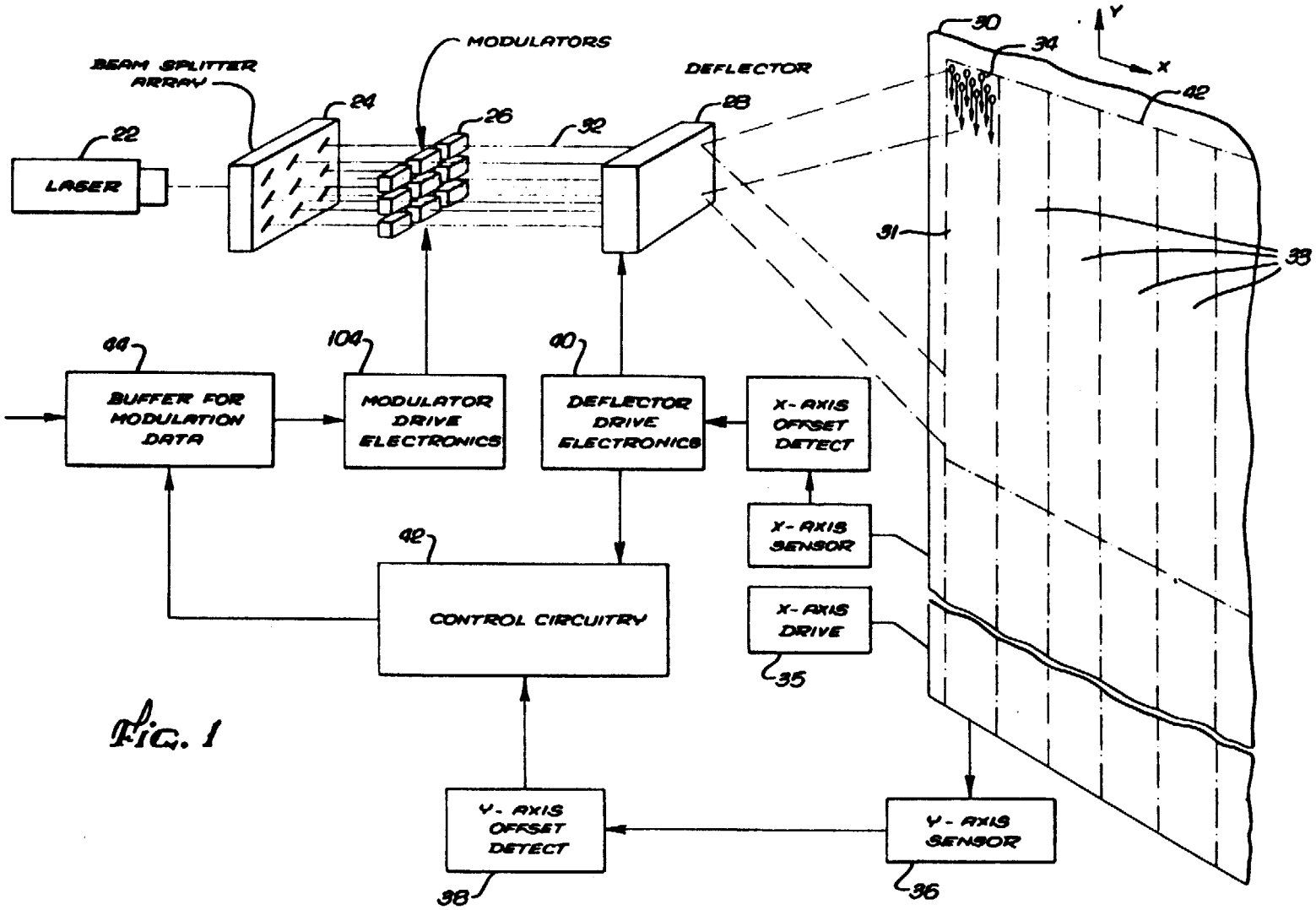
FIG. 1 is a diagrammatic view of the inventive laser pattern generator.

FIG. 1 shows the major components and features of the inventive laser pattern generator. The source of laser radiation used in the preferred embodiment is a continuous helium-cadmium laser 22. A beam splitter arrangement 24 separates the laser beam into a plurality of separate beams which are then selectively modulated by individual modulators 26 in accordance with the integrated circuit pattern to be generated. The beams then pass through a beam deflector 28 and strike the target surface 30, which is a photoresist coated substrate. The substrate may be a piece of glass, if a reticle or photomask is to be generated, or a silicon wafer if an integrated circuit pattern is to be generated directly onto the wafer.

The individual beams 32 strike the workpiece creating thereon an array 34 of non-overlapping beam spots which are precisely separated in both the x and y-directions. The deflector 28, in response to electrical signals, deflects the modulated laser beams 32 through a controllable range of angles so that the array 34 of beam spots sweeps across the target surface 30 in the y-direction, as shown in FIG. 1, thereby generating a portion 31 of the integrated circuit pattern on the target surface 30. Successive portions or blocks 33 of the integrated circuit pattern are then generated during successive deflections of the array 34 of beam spots by deflector 28 by the movement of the target surface 30 in the x-direction. This movement is enabled by the x-axis drive 35 which precisely moves a table on which the target surface 30 is positioned. Thus, on successive deflections of the laser beams 32, contiguous portions of the integrated circuit pattern on the target surface 30 are generated.

In the preferred embodiment, the deflector 28 is an acousto-optical deflector driven by deflector drive electronics 40 so that the laser beams 32 are repetitively swept through a range of angles by the acousto-optic deflector 28. The deflector drive electronics 40 operates in conjunction with control circuitry [41] *42* to initiate the supply of modulation data from a modulation data buffer 44 to the laser modulators 26 via modulator drive electronics 104. The supply of modulation data is begun when the target surface 30 is correctly positioned in the x-direction and when the laser beams 32 are correctly deflected so as to compensate for any y-axis offset error of the target surface.

Figure 3:
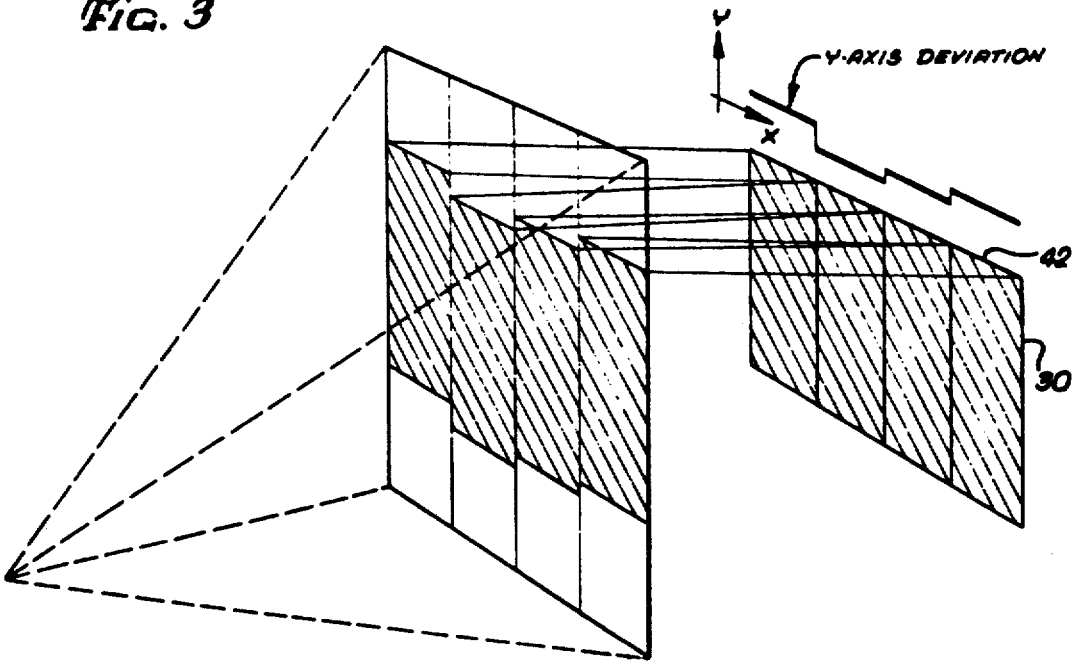
FIG. 3 diagrammatically illustrates the manner of correcting for y-axis positioning error of the target surface.

The system of the present invention contains a means for compensating for the small unavoidable movements of the target surface 30 in the y-direction resulting from the movement of the table in the x-direction necessary in order to generate the successive blocks of the integrated circuit pattern. A y-axis sensor 36 for sensing the deviation of the table and target surface 30 in the y-direction and supplying a signal to the y-axis offset detector 38 is provided. The y-axis offset detector 38 in turn provides a signal to control circuitry 41 for the modulators 26 so that the initiation of modulating signals used to generate the integrated circuit pattern is delayed or advanced during the deflection of the laser beams 32 depending upon the amount and the direction of the offset or deviation of the target surface 30 in the y-direction, as shown in FIG. 3. This enables the contiguous blocks of the integrated circuit pattern written on the target surface 30 to begin along the same arbitrary reference line 42 on the target surface 30 notwithstanding the deviations of the target surface 30 in the y-direction between successive deflections of the laser beams 32.

The components of the preferred embodiment of the present invention are chosen so that an integrated circuit pattern having a minimum pattern detail of 2.5 microns at the format can be generated. To this end, the effective beam diameters of the laser beams at the format are 0.5 microns. The x-address separation, i.e., the separation in the x-direction between the adjacent beams is ½ of the effective beam diameter, or 0.25 microns. Similarly, the y-address separation is 0.25 micron, i.e., each laser beam switches from on to off or from off to on as often as every 0.25 microns during the beam deflection.

In the x-direction, the block width is 16 addresses corresponding to the 16 laser beams used in the preferred embodiment. In the y-direction, during a single deflection of the 16 laser beams, integrated circuit pattern information is written at 1,024 addresses. This number is a function of the particular acousto-optical deflector 28 used in the preferred embodiment. Thus, a block of integrated circuit pattern information generated during one scan or deflection of the acousto-optic deflector has a width of $4\times10^{-4}$ centimeters and a length of $2.56\times10^{-2}$ centimeters.

Figure 2:
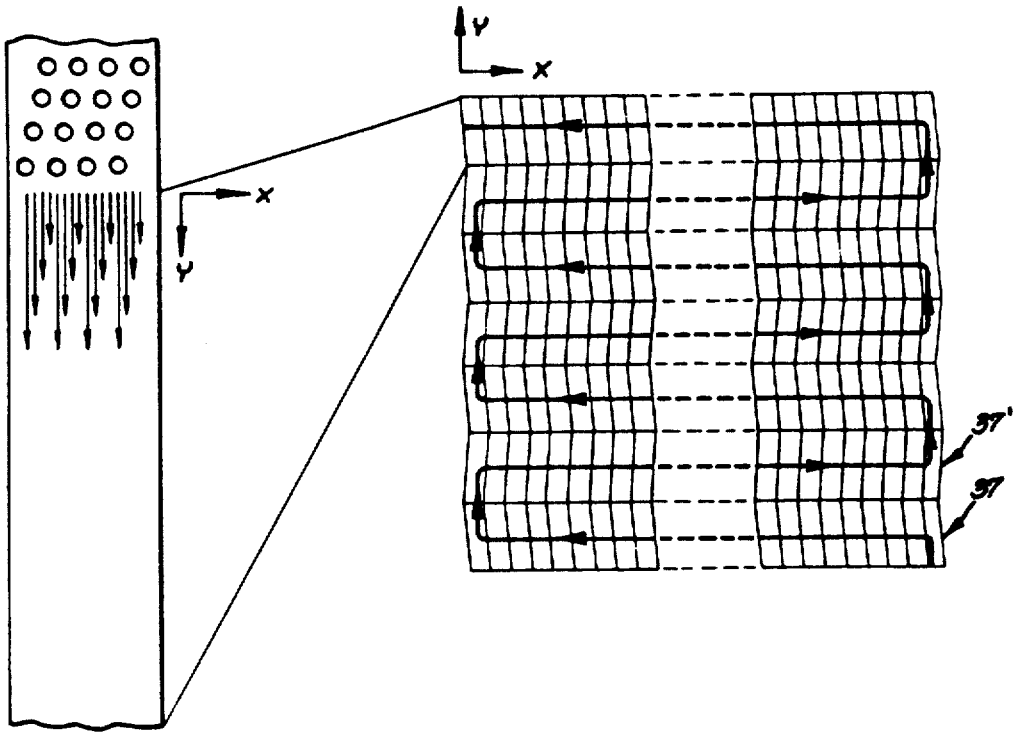
FIG. 2 is a greatly enlarged pictoral representation showing the order of swath-by-swath image formation on the target surface, and also showing the arrangement of laser beams which impinge on the surface to form the image.

It will be appreciated that if the array 32 of the 16 laser beams used in the preferred embodiment were arranged so that the beams all had the same y-addresses, there would be significant overlap among the 16 beams since their diameters are two times the address separation. Because the 16 beams originate from the same single laser source 22, they are spatially coherent with one another. If the beams were, therefore, allowed to overlap such as would be the case if they were all located at the same y-address, there would be, as a result of the spatial coherence, interference effects between the overlapping beams so that the photoresist would not be exposed evenly. Hence, in the preferred embodiment, the 16 beams are not all located at the same y-address but form an array 34 of beams whose centers span a range of 35 address locations in the y-direction, thus assuring that none of the beams overlap each other to produce light and dark fringes. FIG. 2 shows such an arrangement of the 16 beams. In order to compensate for the y-address separation between the 16 beams, it is necessary that the modulation signals for the beams at any y-address be appropriately slightly delayed relative to the other beams.

FIG. 2 also illustrates, not to scale, the manner in which successive blocks of integrated circuit pattern information are written upon the format or target surface 30. Blocks having their leading edge located at the same y-address, are placed contiguously as the target surface 30 is moved in the x-direction in order to form a row, or swath 37 of blocks. After the swath of blocks has been generated, the target surface 30 is moved in the y-direction so that a second row or swath 37' of blocks contiguous with the first swatch is generated. This second swath is generated as the target surface 30 is moved oppositely in the x-direction. The skewing of the blocks in the swaths, exaggerated in FIG. 2 for purposes of illustration, is due to the motion of the target surface 30 in the x-direction. The motion is continuous and thus occurs, in the preferred embodiment, even while the laser beams are being deflected.

As the target surface 30 is moved in the x-direction in order to generate the contiguous blocks of integrated circuit pattern information on the target surface 30, there may be a small amount of undesired motion of the workpiece 30 in the y-direction. Because adjacent addresses in the y-direction are only separated by 0.25 microns, even very small motion of the target surface 30 in the y-direction between the generation of adjacent blocks would result in misalignment of the corresponding addresses in the adjacent blocks unless corrected or compensated for. In the present invention, this deviation or wandering of the target surface 30 in the y-direction, is compensated for by controlling the time, or more precisely the angle of deflection relative to the start of the deflection at which modulation of the laser beams is initiated.

In the present invention, therefore, a means is provided for measuring the y-axis wandering of the target surface 30 in the y-direction. This information is used to delay or advance the writing of the integrated circuit data during the deflection stroke so that contiguous blocks of integrated circuit pattern information begins along the same line on the target surface 30. As illustrated diagrammatically in FIG. 3, on successive strokes of the acousto-optic deflector 28, the modulation of the laser beams with integrated circuit pattern information may vary depending upon the amount and direction of y-axis wandering. Thus, between the beginning of the first stroke and the the beginning of the second stroke shown in FIG. 3, the target surface 30 has moved slightly downward in the y-direction as indicated by the line labeled "y-axis deviation" located above the target surface 30 in FIG. 3. However, since this y-axis deviation is sensed in the present invention, a signal is generated to delay the modulation of the laser beams relative to the beginning of the second stroke. As indicated in FIG. 3, the contiguous blocks of pattern information generated upon the target surface 30 thus begin along a single reference line 42 on the target surface 30.

A more detailed description of the present invention will now be given, and can be understood with reference first to FIG. 4 which is a block diagram of the major optical, electronic and mechanical components of the present invention.

In the preferred embodiment, a helium-cadium laser 22 emitting laser radiation having a wavelength of 4416 A provides a continuous collimated laser beam. Sixteen individual, identical beams are subdivided from the single laser beam by an array of beam splitters 50.

Each of the 16 individual laser beams is then modulated by an individual acousto-optic modulator 26.

The modulator 26 comprises an acousto-optic medium transparent to the laser radiation and a means for producing acoustic waves therein. An acoustic wave propagating through the modulator 26 deflects some of the laser radiation propagating through the modulator 26 into different orders in a manner similar to that of a diffraction grating. After passage through the modulator 26, either the zero order nondeflected laser beam or the first order deflected laser beam is chosen to propagate through the rest of the optical system and to expose the photoresist at the format. If the zero order nondeflected laser beam is chosen, the laser beam propagating through the optical system is turned "on" while no acoustic wave is propagating through the acousto-optic modulator 26 and is turned "off" while an acoustic wave is driving the modulator and causing the laser beam to be at least partially deflected from the zero order.

The choice of whether the zero or the first order is chosen depends upon the modulation efficiency which is achievable with the acousto-optical modulator 26, the intensity of the laser beam 32 available at the format or target surface 30 and the properties of the photoresist used. Typically, when an acousto-optic modulator is driven by a signal to deflect the incident laser beam into the first order, some residual light remains in the zero order. If this residual light is of a low enough intensity level so as not to expose the photoresist at the format, the laser beam may be considered to be turned off and the zero order may be used. This is advantageous in that the total intensity of the laser beam is available in the zero order during periods when the laser beam is turned on, i.e., when an acoustic wave is not propagating through the modulator. Correspondingly, it is typically not possible to deflect 100 percent of the laser radiation incident onto the modulator 26 into the first order; some remains in the zero order and/or is deflected to other orders. However, 100 percent modulation efficiency of the laser beam in the first order is achievable since no laser radiation is deflected into the first order during the time that the acousto-optic modulator 26 is not being driven. In the preferred embodiment, the first order deflected laser beam from the acousto-optic modulator 26 is chosen to propagate through the optical system to the format. The present invention, however, includes within its scope the use of the zero order non-deflected laser beam, or the deflected laser beams of other orders. Methods other than acousto-optic modulation may also be used in order to modulate the laser beams in accordance with the integrated circuit pattern information to be generated on the target surface 30 and are within the scope of the present invention.

Even though the minimum pattern detail, 2.5 microns in the preferred embodiment, is 10 addresses on the target surface 30 in extent, it is still necessary, in order to obtain good line edges in the pattern, to turn the individual laser beam modulators 26 on and off sharply for each address. The minimum amount of time that it takes an acousto-optic modulator to turn a laser beam on and off varies with the diameter of the incident laser beam, the smaller the incident laser beam diameter, the faster the laser beam may be turned on or off. In the preferred embodiment, therefore, each acousto-optic modulator 26 is inserted at the focus between the two converging lens of a unity afocal telescope of the astronomical type. This maximizes the sharpness with which the laser beam can be switched on or off and with which the integrated circuit pattern can be written.

After passage through the individual modulators and optics 26, each laser beam is directed through a re-imaging lens 52 before it is combined with the other beams by means of a second array of beam splitters 54. This second array of beam splitters 54 recombines the individual laser beams so that they propagate in the same general direction, but not along the same line. The laser beams form an array of nonoverlapping nearly-focused beam spots at a plane near to the foci of the re-imaging lenses 52, the array of beams being arranged according to the same pattern as shown in FIG. 2.

A scanning field plate 56, comprising a diaphram having an array of 16 apertures corresponding to the 16 laser beams is placed in this plane. The apertures are approximately equal in size to the diffraction-limited beam diameter of the laser beams at that point and are arranged according to the same pattern formed by the laser beams at the format or target surface 30 as shown in FIG. 2. The scanning field plate 56 removes unwanted laser radiation around the main portions of the beams so that it does not propagate and cause blurring of the focused laser beams at the format or target surface 30, thereby degrading the quality of the integrated circuit pattern generated on the photoresist.

The remainder of the optical system can be thought of as re-imaging the array of laser beams at the scanning field plate 56 on the target surface 30, demagnified by a factor of approximately 1,000. In order the achieve the high optical resolution necessary to produce a clear re-imaging of the 16 beam array at the format or target surface 30, the optical components used in the present invention between the scanning field plate 56 and the format 30 must be of excellent overall quality, i.e., the total wavefront deformation from the scanning field plate 56 to the format 30 should be one quarter of a wavelength or less.

The first optical component in this part of the optical system is a field lens 58 which is placed closely adjacent to the scanning field plate 56. Field lens 58 reduces the angular spread of the laser beams so that they are entirely within the entrance aperture of the beam expanding optics 59.

The beam expanding optics 59 are necessary because the acousto-optic deflector 28 used in the preferred embodiment has an optical aperture of 4.1 centimeters in the direction of the angle of deflection of the laser beams and in order that the acousto-optic deflector 28 be used efficiently, the beam incident on this aperture should almost fill the aperture. The beam expanding optics 59 are therefore selected to provide a collimated beam (comprised of the 16 individual laser beams) whose diameter at the output of the beam expanding optics 59 is approximately 3.8 centimeters. A variety of optical components may be chosen and combined to produce such a beam. The preferred embodiment, for example, uses compound lenses in an astronomical telescope-type configuration in order to produce a suitably sized high quality beam.

The acousto-optical deflector 28 used in the preferred embodiment of the present invention is model AOD-150 manufactured by Intra-Action, Inc. While, as has been stated, the aperture of the acousto-optic deflector 28 is 4.1 centimeters in the direction of the angle of deflection, in the direction perpendicular to this, the aperture is only approximately 0.1 centimeters. This necessitates that the beam be essentially focused in the direction perpendicular to the direction of deflection in order to pass through the acousto-optic deflector 28. The acousto-optic deflector 28 is therefore placed so that its center is at the focus of the first converging cylindrical lens 60 which intercepts the 3.8 centimeter diameter collimated beam exiting the beam expanding optics 59. The axis of the first converging cylindrical lens 60 is oriented parallel to the angle of deflection of the laser beams by the acousto-optic deflector 28. The beam at the center of the acousto-optic deflector 28 has, therefore, a dimension of 3.8 centimeters in one direction while being at a focus in the other direction so that the entire beam passes through the acousto optic deflector 28. On the output side of the acousto-optic deflector 28, a second converging cylindrical lens 64, also with its axis oriented parallel to the angle of deflection of the laser beams is placed to recollimate or nearly recollimate the beam in the direction perpendicular to the direction of deflection.

The acousto-optic deflector 28 comprises a flint glass acousto-optic medium, through which the laser beams pass, with piezo-electric transducers attached in order to generate acoustic waves within the flint glass medium. The transducers are placed so that the acoustic waves propagate in a direction parallel to the longer side of the aperture of the deflector 28 causing the laser radiation incident on the acoustic optic medium to be deflected at an angle in that direction into different orders. Because a high percentage of the laser radiation incident on the acousto-optic deflector can be deflected into the first order through utilization of the phenomenon known as the Bragg effect, the deflected order of laser beams chosen to propagate to the format is the first order in the preferred embodiment of the present invention.

In the present invention, the utility of the acousto-optic deflector 28 derived from the fact that the angle of deflection for any of the deflected orders depends upon the wavelength of the acoustic wave propagating through the acousto-optic medium. Since the wavelength of the acoustic wave propagating in the acousto-optic medium in turn depends upon the frequency of the electrical signal driving the piezo-electric transducers, the angle of deflection of the laser radiation within an order depends upon the frequency of the driving signal to the piezo-electric transducers. Furthermore, a given angular deflection within any one order will be produced only by a driving signal of a certain frequency.

In the preferred embodiment, the acousto-optic deflector drive electronics 62 includes a voltage controlled oscillator which repetitively sweeps from 210 MHz to 110 MHz in 137 microseconds. The laser beams exiting the acousto-optic deflector 28 are thus repetitively swept through an angle. This angular deflection is imaged at the format 30 so that the laser beams sweep in the y-direction on the format or target surface 30.

Because the driving signal applied to the piezo-electric transducers is, during each sweep, of a constantly changing frequency, there is a slight variation over the length of the aperture of the frequency of the acoustic waves propagating in the medium at any one given time. In the case of the driving signal sweeping from a higher to a lower frequency as in the preferred embodiment, this causes the acousto-optic deflector 28 to act like a slightly diverging cylindrical lens having an axis oriented in the direction perpendicular to the direction of propagation of the acoustic waves through the acousto-optic deflector medium. In order to maintain the high optical quality necessary for producing the required laser beam spot array at the format or target surface 30, this effect must be corrected for. One method of correcting for this effect is to place a weakly convergent cylindrical lens having its axis oriented perpendicular to the direction of propagation of the acoustic waves in the acousto-optic deflector 28, (i.e., with its axis perpendicular to the axes of the cylindrical lenses 60 and 64) between the second cylindrical lens 64 and the beam reducing optics 66.

A second and preferred method for correcting this effect is to slightly reposition the second cylindrical lens 64 to form a uniformly slightly diverging beam and to reposition one or more lenses of the beam reducing optics 66 to correct for this uniform divergence.

In the preferred embodiment, the beam reducing optics 66 is a telescope of the Galilean type using a converging lens and a diverging lens to produce at its output an array of small collimated beams of laser light. A microscope objective 68 or other focusing lens is then used to focus the array of collimated beams of laser light onto the format or target surface 30. The beam reducing optics 66 and the microscope objective 68 are chosen so that the diameter of the laser beam spot on the format or target surface 30 is approximately [1.0] *0.5* microns in diameter. A z-axis position sensor and control 69 allows the position of the microscope objective to be slightly adjusted in the direction perpendicular to the target surface 30.

Since adjacent addresses at which integrated circuit pattern information is to be written onto the target surface 30 are preferably only 0.25 microns apart, the target surface 30 must be provided with means for measuring its position and positioning it in both the x- and the y-directions so that contiguous blocks and swaths of the integrated circuit pattern are properly located on the target surface 30.

In order to assist in achieving this end, the target surface 30 is situated on a table 70 which is capable of moving with great precision in the x- and y-directions by means of an x-axis drive 72 and a y-axis drive 73 respectively. In addition, the table 70 is provided with position sensing means 78 and 80 for accurately measuring the position of the table 70 and target surface 30 in both the x- and y-directions.

Both the x-axis drive 72 and the y-axis drive 73 initiate the movement of the table 70 in response to signals from a computer memory 74. During the period when the contiguous blocks within a single swath are being generated the computer memory 74 is fully utilized in supplying the modulation data for the integrated circuit pattern to the acousto-optic modulators 26, and is not available to control either the x-axis drive 72 or the y-axis drive 73. Computer memory 74, in cooperation with the x- and y-axis drives 72 and 73 and the x- and y-axis position sensing means 78 and 80, is, however, used to correctly position the target surface 30 and table 70 in both the x- and y-directions before the beginning of the generation of the integrated circuit pattern and during the periods after the generation of one contiguous swath and before the generation of the next contiguous swath. Since the table 70 moves in the x-direction during the generation of the contiguous blocks of a swath and the computer memory 74 is not available to provide signals to control this motion during that time, the x-axis drive 72 is provided with control hardware 76 to control the rate of motion of the table 70 in the x-direction. Rate control hardware 76 uses signals from the x-axis position sensing means 78 to maintain the motion of the table 70 and target surface 30 at an approximately constant rate while the blocks within a swath are being generated.

Information concerning the position of the target surface 30 and table 70 provided by the x- and y-axis position sensing means 78 and 80 respectively is used not only to assist in properly locating the target surface 30 and table 70 at the beginning of the generation of the integrated circuit pattern and between the generation of contiguous swaths, as has already been mentioned, but also to control the initiation of both the acousto-optic deflections and the modulation of the laser beams relative to the position and motion of the target surface 30 and table 70. A signal originating with the x-axis position sensing means 78 is used to initiate the acousto-optic deflection of the laser beams while a signal originating with the y-axis position sensing means is used to determine when, during the acousto-optic deflection of the laser beams, the modulation of the beams with integrated circuit pattern information is to begin.

In the preferred embodiment, the x-axis position sensing means 78 is an x-axis laser interferometer and detection circuit 78, while the y-axis position sensing means 80 is a y-axis interferometer and detection circuit 80. Such interferometers are commercially available and are capable of measuring displacements with an accuracy of one-twentieth of a wavelength of the laser light used in the interferometer, which is typically helium-neon laser light having a wavelength of 6238A. Such an interferometer is capable of measuring displacements, and hence positions, with an accuracy of approximately 0.08 microns.

Each of the interferometer and detection circuits 78 and 80 produces pulses at its output resulting from alternate light and dark interference fringes incident on a stationary photodetector associated with the interferometer as the target surface 30 and table 70 move relative to the photodetector in the associated direction. Pulses are either positive or negative depending upon whether the motion of the table is toward or away from the photodetector. Displacement to within one-eighth of a wavelength is therefore measured by keeping track of the number of positive and negative pulses that occur measured from a designated starting point.

First and second x-axis displacement counters, 86 and 88 respectively, are provided to count the number of pulses from the x-axis interferometer and detection circuit 78 in order to indicate the position of the target surface 30 and table 70 in the x-direction. The first x-axis displacement counter 86 is reset by the computer memory 74 only when the target surface 30 and table 70 are correctly positioned prior to the intiation of the generation of the integrated circuit pattern data onto the target surface 30. The pulse count of counter 86 is thus at all time indicative of the displacement along the x-axis of the target surface 30 and table 70 from the x-axis starting point. The second x-axis displacement counter 88 is reset after each of the deflections of the laser beams.

Like the first x-axis displacement counter 86, the y-axis displacement counter 82 is reset by the computer memory 74 only prior to initiation of the generation of the integrated circuit pattern data onto the target surface 30, and thus its count is indicative of displacement along the y-axis at any time during the generation of the integrated circuit pattern information.

Prior to the initiation of the generation of integrated circuit pattern information onto the target surface 30, the computer memory 74 loads first register 84 with the x- and y-coordinates, relative to the starting point, of the initial block and swath to be generated and thereafter, at the end of each swath, with the new x- and y-coordinates of the block and swath to be generated. These coordinates are measured from a designated starting point at which the first x-axis displacement counter 86 and the y-axis displacement counter 82 have been reset and are inserted into first register 84 expressed in units of one-eighth wavelengths of the helium neon laser interferometer light.

The x value stored in first register 84 is provided to a comparator 90 in which it is compared with the number of pulses counted by the first x-axis displacement counter 86. The output of first comparator 90 indicates the difference between the desired and actual positions of the target surface 30 and table 70 and can be interrogated by the computer memory 74 between the generation of adjacent swaths of integrated circuit pattern information. The computer memory 74 can then provide the signal to the x-axis drive 72 in order to correctly position the table 70 before the generation of the next swath. During the generation of the swaths, the computer memory 74 is dedicated solely to providing the data for modulating the laser beams and cannot interrogate comparator 90 nor provide signals to either the x-axis or y-axis drives 72 and 73.

The y value stored in first register 84 is supplied to a first input of a subtractor 92. The output of the y-axis displacement counter 82 is supplied to the second input of the subtractor 92. The output of the subtractor 92 indicates the position of the workpiece 30 and the table 70 in the y-direction, and as in the case of the first comparator 90 used in determining the difference between the desired and actual positions in the x-directions, the subtractor 92 may be interrogated by the computer memory 74 during the intervals between the generation of adjacent swaths of integrated circuit pattern information on the target surface 30.

The computer memory 74 supplies the second register 91 with the value of the width of the blocks of integrated circuit pattern information that are to be generated expressed in units of one-eighth wavelengths. This block width value is supplied by register 91 to the input of second comparator 94 for comparison with the output of the second x-axis displacement counter 88. The second x-axis displacement counter 88 is initially reset by the computer memory 74 when the target surface 30 and table 70 are correctly positioned in the x-direction at the edge of the first block in each swath to be generated. It is thereafter reset automatically at the edge of each successive block within the swath when the output of the counter 88 applied to one input of the second comparator 94 equals the block width in register 91 applied to the second input of the second comparator 94.

The signal produced by the second comparator 94 when the two input signals are equal not only resets the counter 88 described above, but initiates block start trigger circuit 96. This causes the acousto-optic deflection drive electronics 62 to begin its frequency sweep and hence the deflection of the laser beams. Thus, the successive deflections of the laser beams by the acousto-optical deflector 28 are automatically initiated by movement of the target surface 30 and table 70 successive distances equal to the block width.

Signals from a modulation gate 100 are correlated with the frequency sweep of the acousto-optic deflection drive electronics 62. These signals cause preprocessed information stored in computer memory 74 and supplied to modulation data buffer 98 to be provided at the appropriate times during the deflection of the laser beams to the modulator drive electronics 104. The laser beams are thereby modulated on and off by the acousto-optic modulators 26 in accordance with the integrated circuit pattern information. The individual beam modulation delays 102 compensate for the fact that the laser beams are not all located at the same y-address, as has been discussed with reference to FIG. 2, and that therefore, the modulating signals for corresponding y-addresses for some laser beams must precede those for others.

While the target surface 30 and table 70 are moving in the x-direction during the generation of the contiguous blocks within a single swath, the table 70 deviates or wanders slightly from its desired position in the y-direction. This undesired movement is very small. However, since adjacent addresses in the y-direction are separated by only 0.25 microns in the preferred embodiment, even a very small movement between successive deflections of the laser beams may result in a misalignment of corresponding data points in the adjacent blocks. Correction for this effect to an accuracy of one-third of an address, or less, by mechanically repositioning table 70 and target surface 30 is highly impractical, if not impossible.

Compensation for such y-axis positioning error or "wandering" is accomplished by the present invention, as described below. Furthermore x-axis positioning error is substantially eliminated by initiating the laser beam deflection for each block when the target surface is exactly correctly positioned in the x-direction. This is accomplished by using, inter alia, the comparator 90 to ascertain such correct positioning. Such operation also is described below in connection with FIG. 8.

If y-axis wandering did not exist, the timing of the application of modulating data to the acousto-optic modulators 26 could take place at a predetermined time or frequency during the deflection of the laser beams by the acousto-optic deflector 28. In such a case, the modulation gate 100 could be controlled merely by a signal directly from the acousto-optic deflection drive electronics 62.

In order to synchronize the initiation of the modulation of the laser beams with the deflection of the laser beams, taking into account the y-axis wandering, a signal is applied from the acousto-optic deflection drive electronics 62 to a counter 106. This signal is correlated to the deflection of the laser beams so that the count in counter 106 is indicative of the angular position of the laser beams during the deflection. The counter 106 will have a certain count value at that point during the deflection of the laser beams when modulation of the laser beams should begin by the acousto-optic modulators 26 if the target surface 30 is in fact located at the correct position in the y-direction. On either side of this nominal zero-error count value; the counter 106 records a count which reflects the number of one-eighth wavelengths of the laser light used in the x-axis interferometer 78, measured at the target surface 30, that the laser beams are distant from the zero-error position during the deflection.

The output of counter 106 is supplied to a first input of third comparator 108. The output of subtractor 92, which indicates the number of one-eighth wavelengths that the target surface 30 and table 70 have deviated from the desired y-position, comprises the second input of the comparator 108. The comparator 108 provides an output to the modulation gate 100 to initiate modulation of the laser beams only when the inputs from the subtractor 92 and the counter 106 are equal.

If the target surface 30 has not wandered from the desired y-position, the third comparator 108 will produce an output to the modulation gate 100 when the count in the counter 106 corresponds to the zero-error value. This will occur at the time during deflection of the laser beams when modulation of the laser beams would be initiated in the event of no y-axis wandering.

If in fact the target surface 30 has deviated from the desired y-position, the subtractor 92 will have a correspondingly altered output. Since the output signal from the third compartor 108 occurs when the signal from the subtractor 92 is equal to the count from the counter 106, the output signal from the third comparator 108 is effectively advanced or delayed so that the initiation of the modulation is correspondingly advanced or delayed relative to the deflection of the laser beams. The result is that, notwithstanding the deviation in the y-direction by the target surface 30 and table 70, the contiguous blocks in the swath all begin at the same y-position, as illustrated in FIG. 3.

In addition to the y-axis wandering which has just been described, other errors in the precise locations that integrated circuit pattern information is generated on the target surface 30 can result from variations in the starting frequency of the voltage controlled oscillator used in the acousto-optic deflector drive electronics 62; from nonlinearities in the slew rate of the voltage controlled oscillator; and from temperature variations which cause the index of refraction of the acousto-optic deflector medium to change.

Since the angle at which the laser beams are deflected by the acousto-optic deflector depends upon the frequency of the driving signal supplied by the voltage controlled oscillator, an error in this frequency at any time will translate directly into an error in the angular deflection of the laser beams. With the preferred embodiment, for example, a one percent error in frequency will give rise to an unacceptable error of approximately 30 or more addresses at the target surface 30.

One approach to eliminating the error arising from possible variations in the starting frequency and slew rate of the voltage controlled oscillator is to stabilize, by electronic methods, both the starting frequency and the slew rate of the oscillator. However, in order to reduce the possible error to acceptable limits, i.e., to approximately 0.3 addresses at the target surface, the starting frequency and the slew rate of the voltage controlled oscillator must be stabilized to 0.01 percent accuracy or better. If this accuracy is achieved, the modulation of the laser beams can be initiated at a measured time after the initiation of the acousto-optic deflection of the laser beams and the modulation data thereafter clocked out from the modulation data buffer 98 at a constant predetermined rate.

While the present invention embraces the above-described concept of electronically stabilizing the voltage controlled oscillator, a different less costly approach is used in the first described preferred embodiment.

Figure 4:
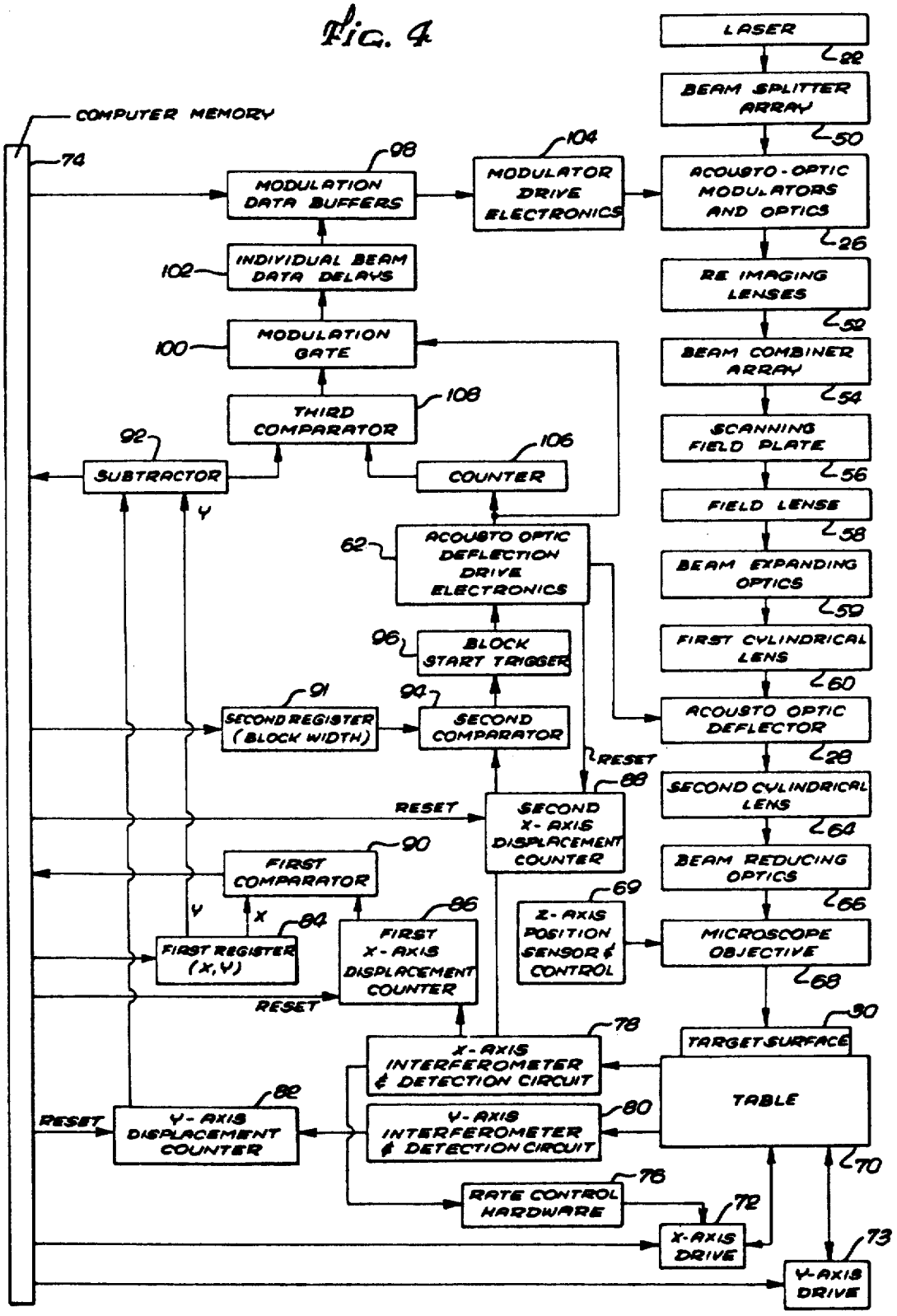
FIG. 4 is a block diagram of the overall laser pattern generator including both optical and electronic components.
Figure 5:
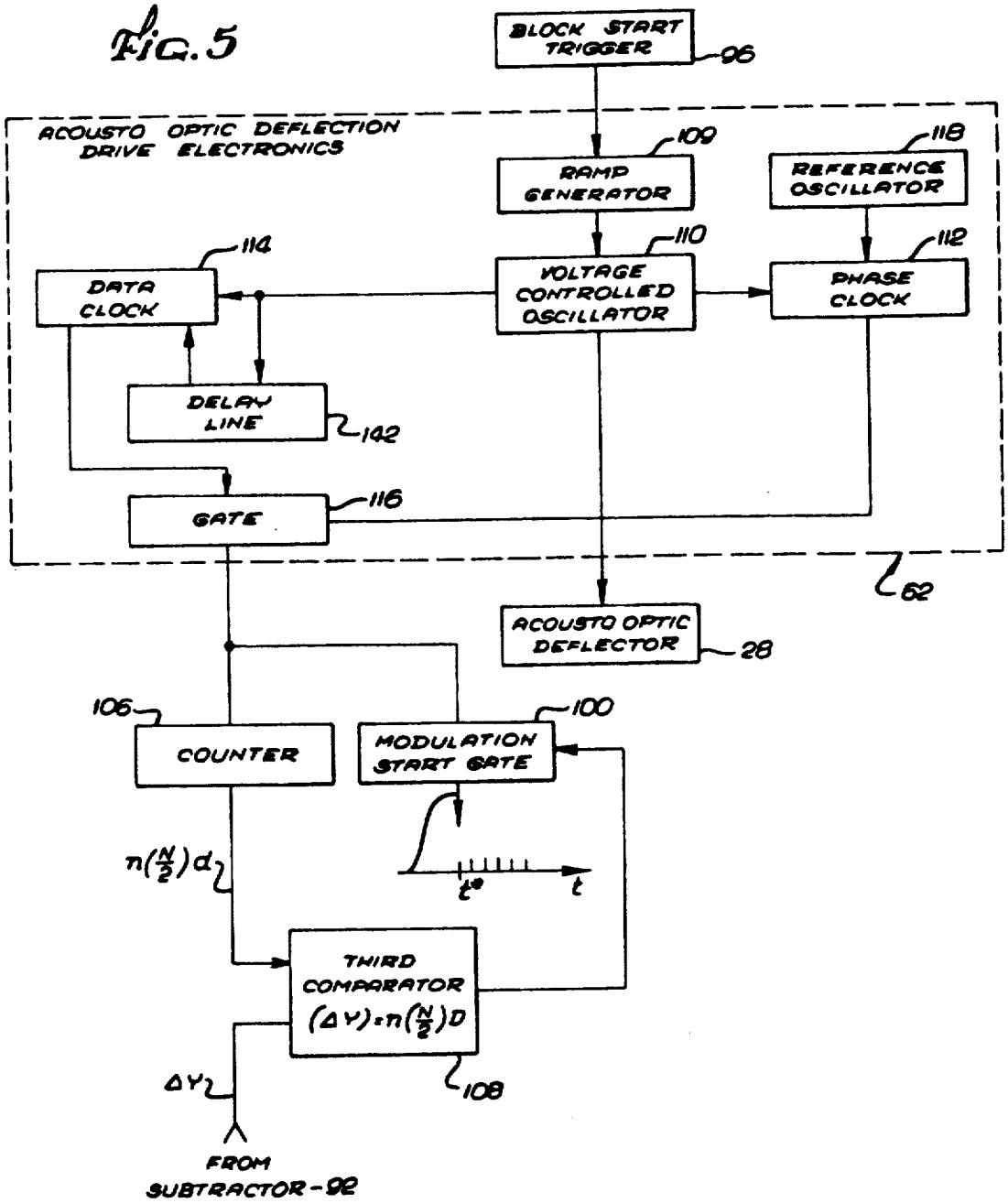
FIGS. 5, 6 and 7 are electrical block diagrams of the acousto-optic deflection drive electronics and of the phase clock and data clock components thereof.

The components of the acousto-optic deflector drive electronics 62 used in this approach are shown in block diagram form in FIG. 5. A ramp generator 109 provides the control voltage for the voltage controlled oscillator 110. The ramp is initiated by a signal from the block start trigger 96 as has been described with reference to FIG. 4. This circuit does not stabilize and linearize the voltage controlled oscillator 110 to an accuracy of 0.01 percent or better and thereafter precisely time the modulation signals to the modulator drive electronics 104 and the acousto-optic modulators 26. Rather, in the preferred embodiment of FIG. 5 the frequency of the voltage controlled oscillator 110 is, in a sense, tracked so that the modulation data is supplied to the modulator drive electronics 104 and the acousto-optic modulators 26 when the voltage controlled oscillator 110 is at specified frequencies in its sweep, rather than at predetermined times. The present invention therefore uses a so-called phase clock 112 to ascertain a modulation data start point that is correlated with a certain deflection angle imparted by the acousto-optic deflector 28.

After this initial synchronization by the phase clock 112 has been done, a data clock 114, controlled by the voltage controlled oscillator 110, is used to establish the times corresponding to each of the writing addresses during the deflection stroke. The data clock timing pulses occur at a repetition rate established by the rate of change of frequency of the VCO 110 output signal which drives the acousto-optic deflector 28. The phase clock 112 opens a gate 116 at the modulation data start point, after which the opened gate supplies the data clock signal to the modulation gate 100.

Figure 6:
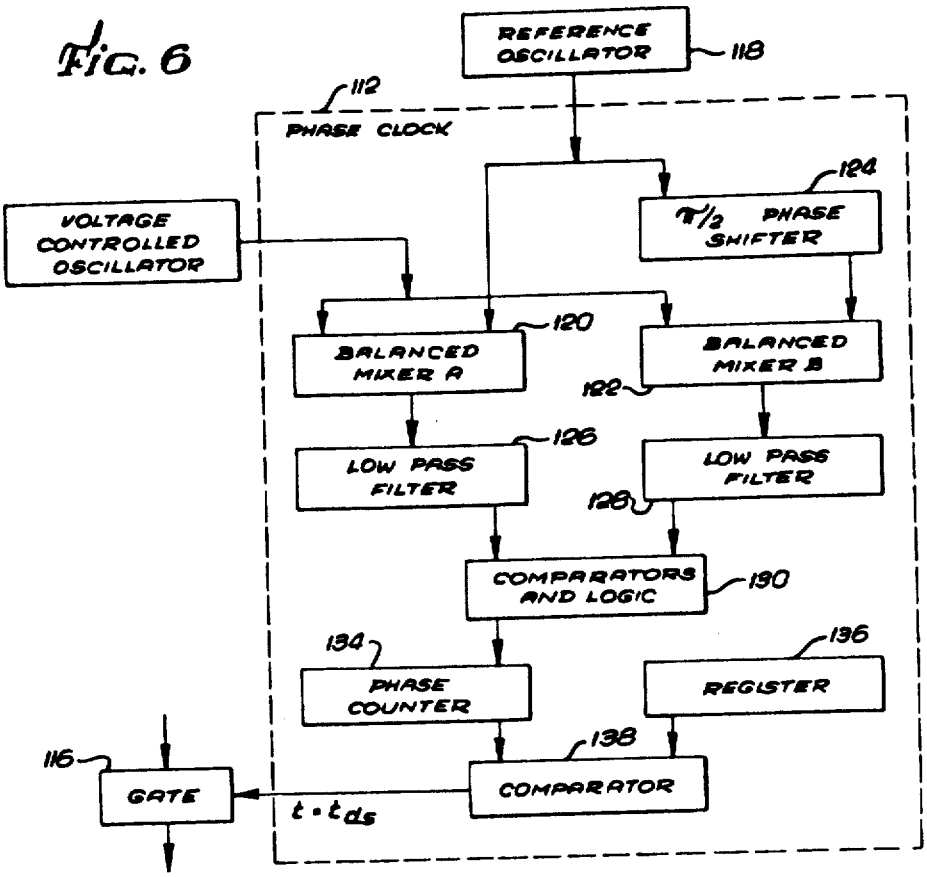

FIG. 6 is a block diagram showing the major components of the phase clock 112. Phase clock 112 uses a crystal-controlled reference oscillator 118 having a precisely controlled output frequency and dual outputs, one of which is shifted in phase by $\pi/2$ radians in phase shifter 124. The two outputs are mixed with the output of the voltage controlled oscillator 110 in two balanced mixers A and B, 120 and 122 respectively, so that the balanced mixers 120 and 122 operate in quadrature. The outputs of these mixers are filtered by low-pass filters 126 and 128, respectively, before being provided to comparators and a logic network in order to determine the starting point for synchronizing the modulation with the deflection of the laser beams. The output signals of the balanced mixers 120 and 122, $V_A$ and $V_B$, respectively, are 90 degrees out of phase since the output of the reference oscillator 118 is shifted by 90 degrees before being provided to balanced mixer 122. Thus, assuming that the outputs of the balanced mixers 120 and 122 have equal maximum outputs, the output of mixer A may be represented by the equation:

$$V_A(t)=\cos\phi(t)$$

while the output of mixer B would therefore be represented by the equation:

$$V_B(t)=\cos[\phi(t)-\pi/2]=\sin\phi(t)$$

The filtered outputs of the balanced mixers 120 and 122 can be represented on a coordinate system one axis of which represents the output $V_A$ of balanced mixer A, and the other axis of which represents the output $V_B$ of balanced mixer B. The resultant vector, it will be appreciated, rotates about the origin of this coordinate system as a function of time, thus defining a clock hand in a mathematical sense.

The rotating clock hand is of constant length and has an angular position $\phi(t)$ measurable by electronics. The location of the rotating clock hand can be determined by an arrangement of comparators and logic 130. The filtered outputs of the balanced mixers 120 and 122 are compared in four comparators which determine whether (1) $V_A$ is less than zero, (2) $V_B$ is less than zero, (3) $V_A$ is less than $V_B$, and (4) $V_A$ plus $V_B$ is less than zero. The outputs of the four comparators are supplied to a logic network which determines the octant in which the clock hand lies.

In a typical embodiment, the frequency of the voltage controlled oscillator 110 sweeps from a nominal frequency of 210 MHz down to 110 MHz for each deflection of the laser beams. The reference oscillator 118 has a frequency $f_R$ slighly below the starting frequency $f_o$ of the voltage controlled oscillator 110. For example, the frequency of the reference oscillator 118 may be 208.6 MHz. Because the voltage controlled oscillator 110 sweeps continuously from 210 to 110 MHz past this reference frequency, the clock hand continuously rotates about the origin of the coordinate system formed by the $V_A$ and $V_B$ axes, changing its direction of rotation at the instant that the VCO 110 sweeps past the frequency of the reference oscillator 118. This instant at which the clock hand changes direction can be determined by the comparator and logic 130 by noting when the clock hand reappears in any octant, as a result of the change in direction of rotation, after appearing in only one other intervening octant. This instant $t_c$ can serve as a starting point for synchronizing the acousto-optic modulators 26 with the acousto-optic deflector 28 since the frequency of the voltage controlled oscillator 110 is precisely known to be equal to the frequency $f_R$ of the reference oscillator.

At this point a logic signal from comparators and logic 130 to the phase counter 134 resets the phase counter 134 so that it begins counting the number of octants through which the clock hand rotates. Since the frequency is known at the beginning of the octant count, it can be later determined by noting the number of octants through which the clock hand has rotated. The octant count is supplied to a comparator 138 for comparison with a number indicative of the certain frequency $(f_R-f_c)$ that produces a corresponding certain deflection at which modulation data start cycle is to begin. This number is expressed in terms of the number of octants through which the clock hand rotates during the time that the voltage controlled oscillator 110 sweeps from the reference frequency $f_R$ to the certain frequency $(f_R-f_c)$. When the count of phase counter 134 equals the value of register 136, the comparator 138 provides a signal to open the gate 116. The gate 116 then is enabled to provide data clock pulses to the counter 106, to begin y-axis error correction, and thereafter to provide the data clock pulses for timing the supply of pattern data to the modulators 26.

Figure 7:
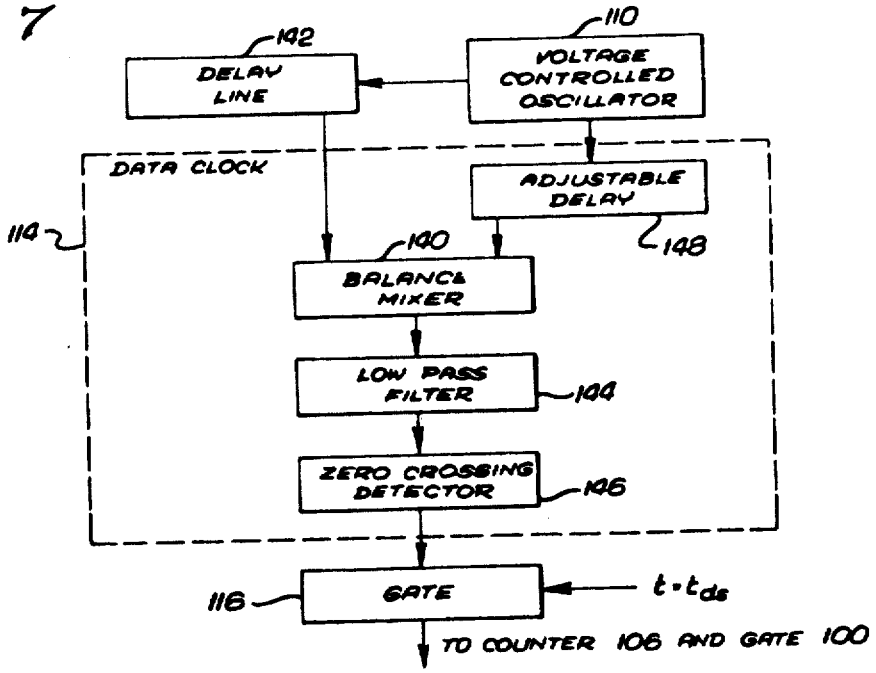

Data clock pulses are derived from the voltage controlled oscillator 110 by the data clock 114. A block diagram of the major components of the data clock 114, along with associated components, is shown in FIG. 7. In the data clock 114, the frequency of the signal from the voltage controlled oscillator 110 is compared in a balanced mixer 140, with the frequency of the VCO 110 output that is delayed a predetermined interval of time in delay line 142. Since the VCO 110 output signal, which is used as the drive signal for the acousto-optic deflector 28, is swept through a range of frequencies, the VCO output itself will have a different frequency from the delayed signal (which corresponds to the VCO output frequency at an earlier time). If the VCO is being swept at a linear rate, i.e., with linear change in frequency as a function of time, the different frequency obtained by the balanced mixer 140 will be constant. As a result, data clock pulses at a uniform rate will be provided to the gate 116 by the mixer 140, low pass filter 144 and zero crossing detector 146. However, if the sweep frequency (and hence the beam deflection) does not change linearly with time, the produced data clock pulses will reflect such differences. If the frequency changes faster, the data clock pulses will occur at a more rapid repetition rate; if the frequency changes more slowly, the repetition rate of the data clock pulses will likewise be slower.

Delay line 142 is preferably an acoustic delay line whose acoustic medium is the same material, e.g., flint glass, as the acoustic medium of the acousto-optic deflector 28. The use of the same acoustic medium in the delay line 142 as in the acousto-optic deflector 28 permits the temperature dependence of the acoustic velocity, and thus the delay in the delay line, to track that in the acousto-optic deflector, resulting in temperature compensation for the system. The adjustable delay 148 allows small adjustments to be made due to different values of the magnification of the optical system, address size, and other factors.

The output of balanced mixer 140 is a signal whose frequency is equal to the difference in frequency between its two inputs. This signal is filtered by low-pass filter 144. Each time that the output of the balanced mixer 140 goes from positive to negative or negative to positive a zero crossing detector 146 produces a data clock pulse which is applied via gate 116 and serves to clock the furnishing of the modulation data in the modulation data buffer 98 to the modulator drive electronics 104. Thus, if the voltage controlled oscillator is sweeping at a slightly faster than normal rate, the frequency of the signal from the balanced mixer 140 will increase. This will result in the zero crossing detector 146 producing data clock pulses at a faster rate. Thus the repetition rate of the data clock pulses is established directly by the rate of change of frequency of the deflector drive signal. Thus the data clock pulse spacing accurately represents unit increments of angular deflection imparted by the deflector 28 regardless of nonlinearity in the sweep frequency ramp.

Output pulses from the data clock 114 are supplied to the counter 106 via the gate 116. The contents of the counter 106 are compared, in the comparator 108, with the effective offset or error position of the target along the y-axis. Since the data clock 114 is accurately tracking the frequency of the drive signal to the acousto-optic deflector 28, the contents of the counter 106 accurately indicate the current position or deflection angle of the beams, as measured from the certain angular deflection corresponding to the frequency $(f_R - f_c)$ at which the phase clock 112 opens the gate 116 to initiate data clock pulse supply to the counter 106.

When the beams have been deflected appropriately to compensate for the target offset error, the third comparator 108 (FIG. 4) produces an output which opens the modulation gate 100. This enables data clock pulses to be supplied via the individual beam data delays 102 to the modulation data buffers 98. Each of the delays 102 corresponds to the offset of the corresponding beam in the y-axis (as illustrated in FIG. 3), as measured e.g., with reference to a certain one of the beams such as that shown in the lower left corner of the array of FIG. 3. The delay circuits 102 cause the data clock pulses to reach the modulation data buffers 98 at different times corresponding to the relative offset positions of each of the corresponding beams in the y-direction in the array. As a result, the pattern data for each beam is supplied to the corresponding modulator 26 at the appropriate time so as to obtain the desired pattern on the target surface, notwithstanding the fact that the individual beams are offset in the array.

The delayed data clock pulses are used to clock out or successively access the pattern data from the modulation data buffers 98. Since the data clock pulse repetition rate is directly tied to the rate of change of frequency of the acousto-optic deflector drive signal, the modulation data will be obtained from the buffers 98 in exact accordance with the actual angular deflection of the corresponding beam. In this way, the supply of data will track the beam deflection even in the event that the rate of change of frequency of the deflector drive signal, and hence the deflection imparted by the deflector 28 is nonuniform. The result is extremely accurate exposure of pattern information onto the target surface. Accurate pattern resolution to the same order of magnitude as the beam diameter can be achieved.

Figure 8:
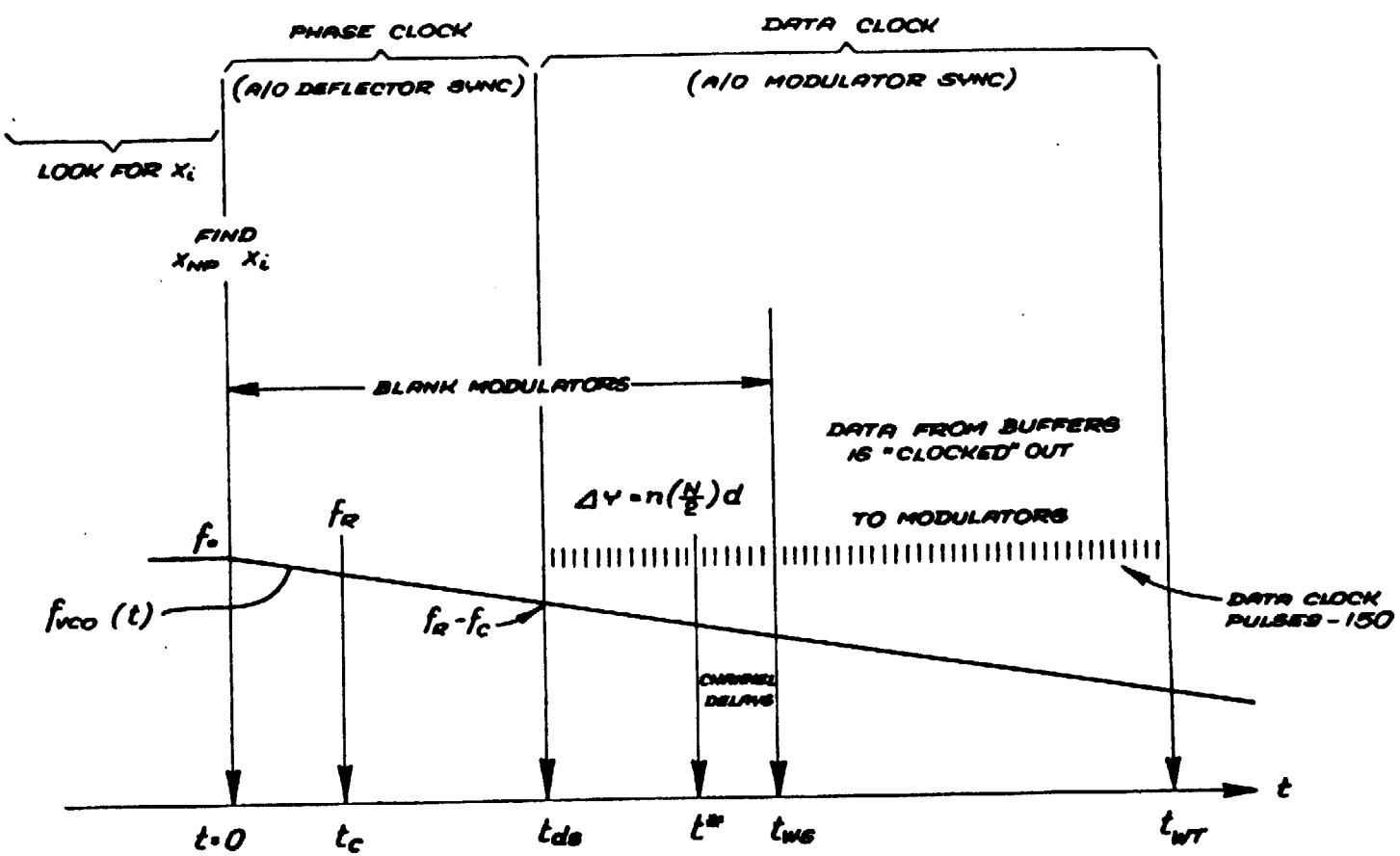
FIG. 8 is a timing diagram showing the temporal sequence of events which occur during one scanning cycle of the inventive pattern generator.

The timing of operation of the acousto-optic deflection drive electronics is illustrated by the chart of FIG. 8. Prior to $t=0$, the x-axis interferometer and detection circuit 78, the displacement counter 88 and the comparator 94 cooperate to determine when the target has been moved sufficiently in the x-direction so as to initiate a new sweep. When this occurs, the block start trigger 96 is actuated and a signal is supplied to the ramp generator 109. The occurrence of that trigger defines the $t=0$ start condition for the events depicted in FIG. 8.

The output frequency of the voltage controlled oscillator 110 is shown as the line designated $f_{vco}(t)$. Although illustrated as a straight line, corresponding to a uniform change in frequency with time, the VCO 110 may in fact vary slightly from this uniform rate of change of frequency.

The reference oscillator 118 produces a signal at a reference frequency $f_R$. As described above, the phase clock 112 determines when the frequency of the VCO 110 exactly corresponds to the reference frequency $f_R$. This occurs at the time $t_c$ in FIG. 8. Since the frequency of the drive signal to the deflector 28 is then exactly known, the corresponding angular deflection is likewise precisely known.

Thereafter, the frequency of the voltage controlled oscillator continues to be measured by the phase counter 134, the register 136 and the comparator 138 in the phase clock 112. When a certain frequency $(f_R - f_c)$ has been reached by the VCO output, the gate 116 is opened. This occurs at the time designated $t_{ds}$ in FIG. 8. Again, since the drive frequency is known at this time, the deflection imparted by the deflector 28 is likewise known.

When the signal $t_{ds}$ occurs, the gate 116 is opened and data clock pulses, generally designated 150 in FIG. 8, begin to be supplied from the data clock 114. The counter 106 begins to count these data clock pulses, each of which corresponds to a certain change in frequency of the acousto-optic deflector, corresponding to a known change in position of the deflected beams on the target surface. This distance is designated $y=n(N/2)d$ where n is the number of pulses counted, N is the number of pattern data addresses per data clock pulse and d is the distance between two adjacent pattern data positions on the target surface.

When the beam has been deflected to an extent appropriate to compensate for the offset or y-axis error in positioning of the target surface, the third comparator 108 (FIG. 4) produces an output signal at a time designated $t^*$ in FIG. 8. Advantageously, the system is arranged so that if there were no positioning error, at least some data clock pulses nevertheless must be produced, and the beams must be deflected at least somewhat from their position at the time $t_{ds}$ before the nominal modulation start position t* is reached. This ensures that the system can compensate for positioning error in either the +y or −y direction, such compensation being indicated by correspondingly more or fewer data clock pulses occurring before the beam is deflected to the appropriate position (at time t*) for beginning modulation.

When that position has been reached by the beams at t*, the modulation gate 100 is opened, but actual modulation may not begin immediately. Rather, the individual beam delays are introduced by the circuits 102. At some later time $t_{ws}$ (for a particular exemplary beam) the writing starts. Pattern data is read out from corresponding modulation data buffer 98 and used to drive the modulator for the corresponding beam. The time $t_{ws}$ will be different for different beams.

Thereafter, pattern data is read out of the data buffers at the rate established by the data clock pulses 150. Since these occur at a rate established by the rate of change of frequency of the deflected drive signal, the pattern data for each beam is always delivered in accordance with the actual deflection of that beam as imparted by the deflector 28 in response to the actual frequency of the drive signal supplied thereto. Finally, when the last desired modulation position is reached, at time $t_{wf}$, the writing terminates and no further pattern data is supplied to the modulator. This completes the modulation portion of the stroke. The procedure is repeated to produce each region in the swath 37. In this manner the desired pattern is generated on the target surface.

In the embodiment just described, the angular deflection of the laser beams, and hence the movement of the laser beams over the target surface, does did not necessarily occur at a constant rate. Thus the frequency of the data clock must be varied accordingly so as to supply modulation data to the laser beams at a correspondingly faster or slower rate, and thereby insure that pattern information is generated at the proper positions on the target surface 30. An alternative approach, illustrated in FIGS. 9 through 14, is to stablize the starting frequency and the slew rate of the voltage controlled oscillator so that both remain constant, advantageously to within 0.01 percent or better. In this case, the laser modulation data may be supplied at a fixed rate, beginning at a set time (after the initiation of beam deflection) dependent only upon the y-axis wandering of the target surface 30.

The electronic system shown in FIG. 9 comprises a linear sweep generating subsystem 201, a data clocking subsystem 203 and, for each channel, a data delivery subsystem 205, each indicated by dashed lines surrounding the components of the particular subsystem.

The behavior of the acousto-optic deflector 28 and the path geometry of the laser beams is such that the deflection of the beam across the target surface is a linear function of the frequency of the signal driving the deflector 28. The linear sweep generating subsystem 201 therefore repetitively provides a signal which sweeps downward in frequency at a constant rate from 210 MHz to 110 MHz so that the laser beams are deflected at a constant rate over the target surface 30. The beginning of each sweep is triggered by a signal from a comparator 206 which signifies that the target surface is in the appropriate position for a block of pattern data to be written.

The data clocking subsystem 203 provides timing signals to the data delivery subsystem 205 for each channel to gate the flow of data from the computer memory 74 to the acousto-optic modulators 26. Because a very linear sweep signal is provided to the acousto-optic deflector 28, the data clocking subsystem 203 may simply employ an oscillator for timing data flow to the modulators 26 that is of a fixed frequency and not controlled by the linear sweep generating subsystem 201. The data clocking subsystem 203 also takes into account the y-axis wandering of the target surface between the generation of successive blocks of pattern data, and accordingly delays or advances the initiation of modulation.

A signal from the computer memory related to the optical magnification of the particular laser pattern generating system is used in order to set the precise frequency of the oscillator used in the data clocking system 203. Thus, where the optical magnification of the particular laser pattern generating system is slightly larger than desired due to the tolerances of the optical components used, the frequency of the oscillator in the data clocking subsystem 203 will be increased slightly. Since the pattern on the target surface 30 is larger, the laser beams are moving at a faster rate over the target surface 30, and therefore the integrated circuit pattern data must be written at a faster rate. Once this frequency is selected for a particular laser pattern generating system, it remains fixed, assuming that there are no further changes in optical components.

Below the dotted line in FIG. 9 is shown the data delivery subsystem 205 for one channel of the laser pattern generating system. The computer memory 74 writes modulation data into selected addresses in a data buffer 238. Signals from the data clocking subsystem 203 read this data out of the buffer 238 at the proper time and rate. Another signal from the computer memory 74 selectively delays the supply of data to each modulation channel in time increments corresponding to the time it takes the laser beams to move a quarter of an address across the target surface 30. This selective delay permits the modulation data for each channel to be delayed or advanced with respect to the other channels, as required by use of the staggered beam pattern shown in FIG. 2. In addition, signal transit time variations between the separate data channels can be compensated for by this selective delay.

The linear sweep subsystem 201 uses a sweeping frequency synthesizer 202 to drive the acousto-optic deflector 28. The synthesizer 202 comprises a voltage controlled oscillator (VCO) whose sweep from 210 to 110 megahertz is made as linear as possible. In addition, every approximately 1.2 microseconds during the VCO sweep, the frequency is corrected. This correction is enabled by a precise crystal oscillator 204 operating at 10.24 megahertz. One output from the oscillator 204 is divided down by a dividing circuit 207 to produce a precise reference frequency of 853⅓ kilohertz.

During the sweep of the VCO in the sweeping frequency synthesizer 202, the output signal is divided (by circuitry in the synthesizer 202) every 1.2 microseconds by a number which changes during the sweep to produce a divided-down signal. The frequency of this signal will be exactly 853⅓ kilohertz if the frequency of the VCO is precisely correct, and will be slightly different if the VCO frequency is not then precisely correct. The frequency of the divided-down signal is compared in the synthesizer 202 with the reference frequency of 853⅓ kHz from the oscillator 204. This comparison produces an error signal which is used to to correct the VCO frequency. As a result, a very linear sweep from 210 MHz to 110 MHz is achieved. This linear sweep signal from the sweeping synthesizer 202 is applied to the acousto-optic deflector 28 to accomplish linear beam deflection.

The VCO sweep in the synthesizer 202 is begun by a trigger signal which indicates that the substrate 30 and table 70 are correctly positioned to begin the generation of a block of pattern detail. In the embodiment of FIG. 9, an X-axis comparator 90' compares the actual position of the target surface 30 and table 70 to the desired position and generates a signal to start the sweep of the synthesizer 202 when those two positions are equal. The actual position of the target surface 30 and table 70 relative to the laser beams may be obtained by an X-axis interferometer and detection circuit such as has already been described. Alternatively, the method described with respect to FIG. 4 using two comparators, one of which is reset at the beginning of each block, may be used.

In the data clocking subsystem 203, the data clock for timing the supply of modulation data originates in a frequency synthesizer 210 that contains a VCO the frequency of which is controlled by the optical magnification of the optical system between the scanning field plate 56 and the target surface 30. Due to the tolerances of the specific optical components used, the optical magnification may vary a slight amount from system to system. This is compensated for by adjusting the frequency of the data clock so that data is written at a faster or a slower rate depending on the optical magnification.

The adjustment of the voltage controller oscillator in the frequency synthesizer 210 is accomplished by dividing the frequency of this VCO by a number related to the actual optical magnification of the particular system. The divided down frequency signal is compared with a 5 kilohertz signal obtained from the crystal oscillator 204 by dividing down its 10.24 megahertz output in a dividing circuit 212. This comparison produces a control voltage which is used to adjust the VCO in the synthesizer 210 to the proper frequency which will compensate for any deviation from design of the optical magnification of the system.

The frequency of the VCO which forms the data clock in the frequency synthesizer 210 is actually 36.36 megahertz, four times the frequency, 9.09 megahertz, at which data is generated onto the target surface 30. As will be described, this signal on the line 211 from the data clock (henceforth sometimes referred to as the "times four data clock") is divided by four to obtain the data clock signal that is used to control the readout of the data buffer 238. The use of the times four data clock permits more accurate correction (to within one-quarter pixel) for y-axis wandering and more accurate image placement by the individual laser beams at the target surface 30, as will also be described.

The approach taken for correcting y-axis wandering is similar to that already described with respect to the embodiment of FIG. 4. Thus, the difference between the actual position and desired position of the target surface 30 and table 70 in the y direction is obtained in a subtractor 92' and provided to a counter 214. At the beginning of the sweep of the VCO in the sweeping frequency synthesizer 202, a signal is generated which opens a gate 216. The data clock, operating at four times the rate that data for individual pixels is written on the target surface 30, then is gated from the synthesizer 210 to the counter 214. The counter 214 is configured to provide an output on a line 215 identified as the $\Delta Y=0$ signal, the occurrence timing of which is related to the amount of y-axis deviation of the target surface 30. The result is that successive blocks of data written on the target surface 30 begin along the same line on the target surface 30 despite any y-axis deviation in the position of the target surface 30 between successive strokes, as has been described hereinabove.

Figure 10:
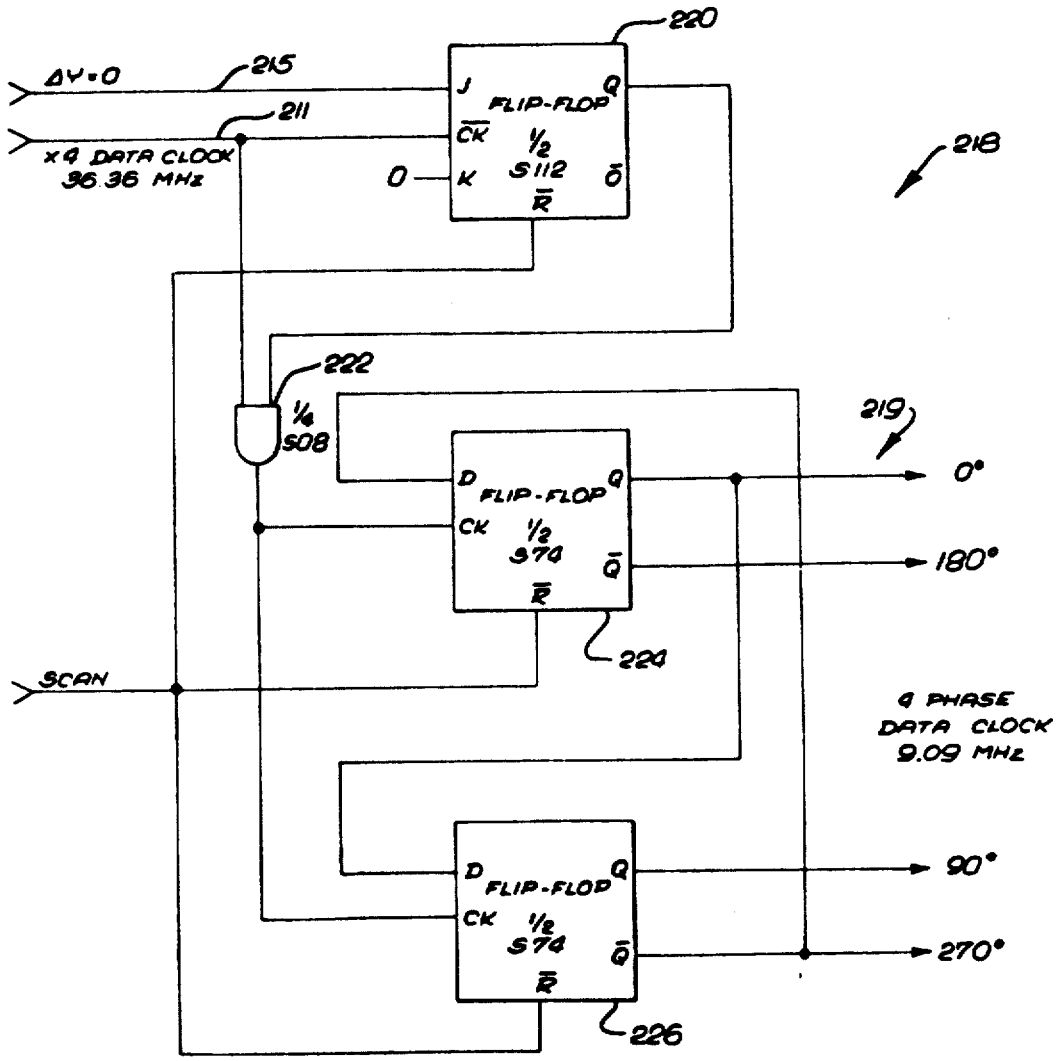

The signal from the counter 214 also is used to close the gate 216 and to initiate the operation of a gate and four phase data clock generator 218 shown in FIG. 10. This circuit 218, using the times four data clock 36.36 MHz, generates four signals at 9.09 MHz, the frequency that each laser beam is modulated and that information is generated onto the target surface 30. These four signals on lines 219 have phases separated by 90 degree increments (i.e. at 0 degrees, 90 degrees, 180 degrees and 270 degrees relative to each other). They are used for gating data at a ¼ address resolution. The signals are obtained by a divider consisting of two flip-flops 224, 226 that are clocked by the four times data clock. This signal is gated in a gate 222 enabled by a flip-flop 220 controlled by the $\Delta Y=0$ signal on the line 215.

All four outputs of the four phase data clock generator 218 are provided to each of the data delay circuits 102a. In FIG. 9, a data delay circuit 102a for only one channel of the data delivery subsystem 205 is shown. In the preferred embodiment, there are sixteen such channels, one for each of the sixteen laser beams that must be modulated.

One of the outputs of the four phase data clock generator 218 is provided to a data buffer read address counter 230. This counter 230 is enabled by a signal from the sweeping frequency synthesizer 202 at the beginning of each scan, and thereafter is incremented by one at each data clock signal. By way of example, the data buffer read address counter 230 may be capable of counting to 1,024, which may correspond to the number of addresses at which pattern information is written onto the target surface 30 by each beam during each stroke. The output of the counter 230 is used to correlate the data stored in the data buffer 238 with the particular addresses at which the data are to be written onto the target surface 30.

The data buffer 238 has two functions. One function is to temporarily store modulation data from the computer memory 74 in random access memories (RAMs). Write addresses from the computer memory 74 are used for this purpose. The second function is to read out the information stored in the RAMs so that it can be applied to the acousto-optic modulator 26. The signals which control the readout of the data from the RAMs originate in the data buffer read address counter 230 as discussed above.

Figure 11:
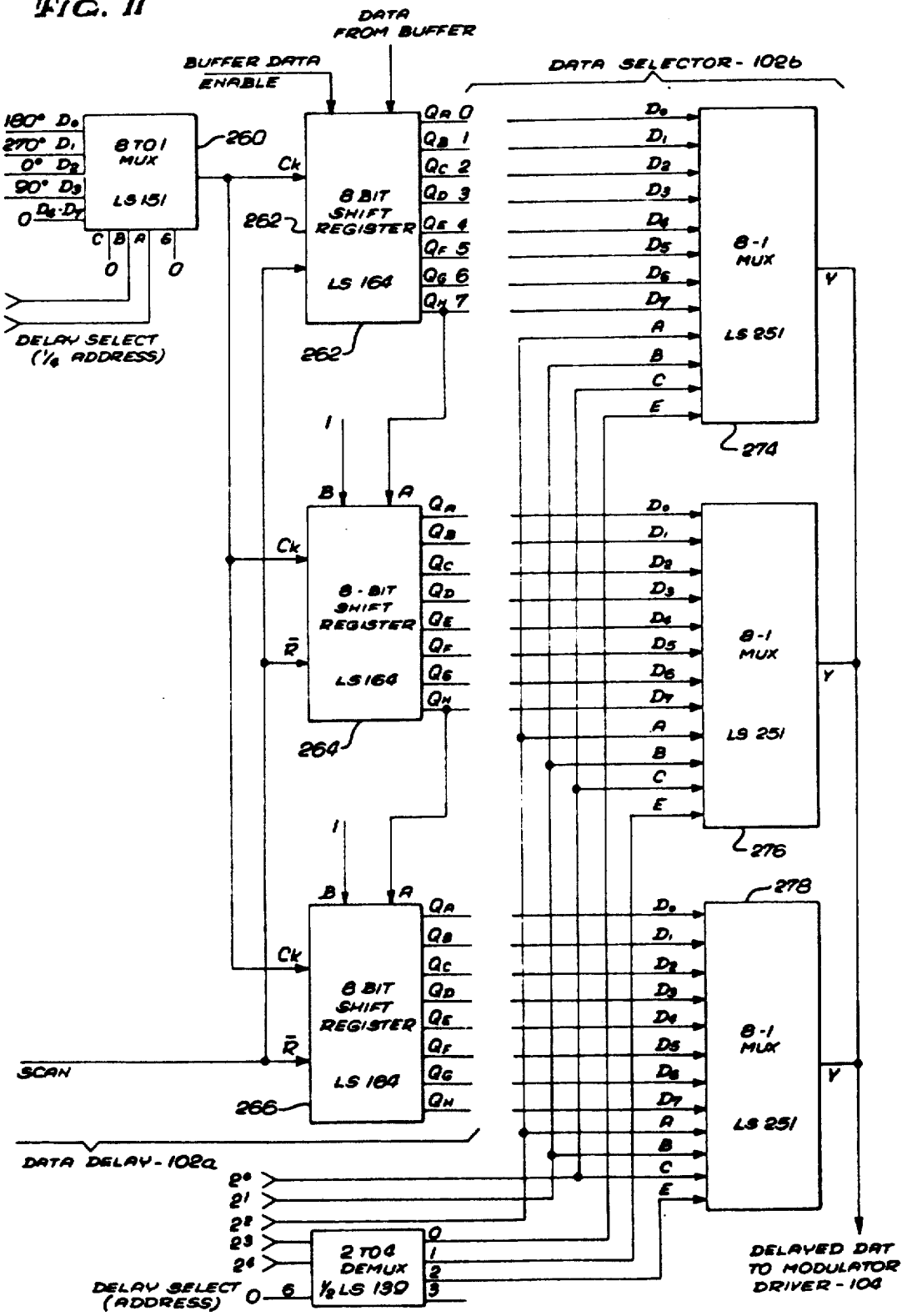

The serial data from the data buffer 238 is applied to the data delay 102a, a block diagram for which is shown in FIG. 11. The four outputs of the four phase data clock generator 218 are applied to four inputs of an LS151 multiplexer 260. One of these signals is selected and applied to the inputs of three LS164 eight-bit shift registers 262, 264, and 266. Since each cycle of any one of the four phase signals from the data clock generator 218 represents one address time, the ability to choose from among four such signals separated in phase by 90 degrees effectively allows a delay to be chosen with a resolution of ¼ of an address time.

The amount of data delay required for a particular channel will of course depend on the relative position in the array of FIG. 2 of the beam corresponding to that channel. This selection is controlled by the host computer which applies a "delay select" signal to the data delay 102a and to a delay selector 102b (FIGS. 9 and 11). Two bits of this "delay select" signal from the computer chooses a particular one of the four phase signals for application to the shift registers 262, 264 and 266 by the multiplexer 260. The shift registers 262, 264 and 266 are clocked by the selected phase clock signal, and are enabled by a "buffer data enable" signal from the address counter 230. The outputs 0 through 23 of the shift registers 262, 264, and 266 are incrementally separated by an amount of time equal to the difference in time between adjacent addresses as they are written onto the target surface 30. Thus each data signal from the data buffer 238 appears 24 consecutive times, at the respective outputs 0–23 of the shift registers 262, 264, 266. The precise timing of these output signals can be controlled to within to ¼ of an address by selection of an appropriate clock phase signal.

While each data signal appears twenty-four times, only the signal appearing at one of these times (i.e., at one of the shift register output lines 0–23) is selected for ultimate application to the modulator driver 104 and the acousto-optic modulator 26. The selection is accomplished by the delay selector 102b of FIG. 11. The outputs 0–23 of the shift registers 262, 264, 266 are applied to corresponding inputs of three LS251 eight-to-one multiplexers 274, 276 and 278. Five bits of the "delay select" signal from the computer memory 74 are used to select one of the 24 outputs for application to the modulator driver 268. The combined effect of the data delay 102a and the data selector 102b is to allow the data for any beam to be adjusted to appear at any selected increment of ¼ of an address over a range of 24 addresses. (This 24 address range can easily be increased by the inclusion of one or more additional LS164 eight-bit shift registers in the data delay 102a and, correspondingly, one or more additional LS251 eight-to-one multiplexers in the delay selector 102b).

The delay adjustment of a particular system (i.e., the specific value of the delay selector address provided to the data delivery subsystem 205) is determined by the delay introduced by electronic components and by the actual mechanical spacing of the laser beams on the scanning field plate 56. This value normally remains constant once it has been set when the laser pattern generator system first is assembled. On the other hand, by use of the four times clock and ¼ address designation scheme of FIGS. 9 and 11, data can be gated through to the beams at the beginning of each Y-sweep with a resolution of ¼ address, thereby facilitating very accurate Y-axis displacement correction.

I claim:

[1. In a laser pattern generating system, the improvement comprising:

laser source means for providing a plurality of coaligned laser beams impinging in noninterfering, mutually closely spaced relationship on the surface of a target;

deflector means for simultaneously deflecting said plurality of coaligned laser beams through a controllable range of angles across a portion of said surface while maintaining said closely spaced relationship; and modulation means, independent of said providing means for selectively, independently modulating said beams during said deflection so that said modulated, deflected beams form an image on said surface.]

2. [A] *In a* laser pattern generating system [according to claim 1 further], *the improvement* comprising:

*laser source means for providing a plurality of coaligned laser beams impinging in noninterfering, mutually closely spaced relationhip on the surface of a target;*

*deflector means for simultaneously deflecting said plurality of coaligned laser beams through a controllable range of angles across a portion of said surface while maintaining said closely spaced relationship; and*

*modulation means, independent of said providing means for selectively, independently modulating said beams during said deflection so that said modulated, deflected beams form an image on said surface;* target movement means for moving said target in a direction lateral to the direction of beam deflection across said surface; and offset detection means, cooperating with said target movement means, for detecting offset of said target in said direction of beam deflection during lateral movement of said target, said modulation means advancing or delaying the initiation of modulation during said deflection in response to the amount of offset determined by said offset detection means, whereby the formed image begins at a uniform reference line on said surface regardless of target offset during said lateral movement.

3. A laser pattern generating system according to claim 2 further comprising:

control means, cooperating with said target movement means and with said deflector means, for causing said deflector means to initiate said simultaneous deflection of said beams when said target movement means has moved said target in said lateral direction through a distance equal the width of the image block formed during a single deflection sweep of said beams through said range of angles, whereby each image block formed by said beams will be correctly positioned on said target immediately adjacent the previously formed image block.

4. A laser pattern generating system according to claim [1] *2* wherein the separation between adjacent beams in the direction lateral to the direction of beam deflection is less than the separation distance required to avoid interference between said beams, but wherein said adjacent beams are spaced sufficiently far apart in the direction of beam deflection so that interference does not occur.

5. A laser pattern generating system according to claim [1] *2* wherein said deflector means comprises an acousto-optic deflector which mutually deflects all of said plurality of coaligned laser beams through a like angle established by the frequency of a signal applied to said acousto-optic deflector.

6. A laser pattern generating system according to claim [1] *2* wherein said laser source means comprises:

a single laser and optics for separating the beam from said single laser into plural closely spaced beams having, at the target surface, mutually offset positions both in the direction of beam deflection across said surface and in a direction lateral thereto, the lateral separation between adjacent beams being less than the distance therebetween at which interference normally would occur, however, the mutual offset distance of said adjacent beams in said beam deflection direction being greater than said interference distance so that actual interference between said adjacent beams does not occur.

7. A method for generating a pattern on a target surface, said target being movable, said target surface having a photosensitive material thereon for exposure by laser radiation, comprising:

storing information indicative of the pattern to be generated;

generating a plurality of laser beams propagating in *substantially* the same direction toward said target surface;

modulating the intensity of each laser beam in accordance with said stored pattern information;

simultaneously deflecting all of said modulated laser beams at a controlled rate, utilizing a single acousto-optic deflector, to expose selectively portions of said photosensitive material on said substrate, said deflecting and modulating steps being coordinated to generate a portion of said pattern; and moving said target relative to said laser beams and repeating said modulating and deflecting steps in coordination with said moving to generate additional contiguous portions of said pattern, *wherein said deflecting occurs in response to a ramped control signal that is restarted each time said target has been moved laterally with respect to the direction of deflection by an amount corresponding to the overal lateral separation between the outermost of said plurality of beams;*

*measuring, at each restart of said ramped control signal, the extent of positional error in the direction of deflection imparted to said target during said lateral movement; and*

*altering the time of initiation of beam modulation during said deflection by an amount necessary to compensate for said positional error, whereby contiguous portions of said pattern begin from a uniform line on said target surface.*

[8. A method according to claim 7 wherein:

said deflecting occurs in response to a ramped control signal that is restarted each time said target has been moved laterally with respect to the direction of deflection by an amount corresponding to the overall lateral separation between the outermost of said plurality of beams.]

[9. A method according to claim 8 further comprising:

measuring, at each restart of said ramped control signal, the extent of positional error in the direction of deflection imparted to said target during said lateral movement, and altering the time of initiation of beam modulation during said deflection by an amount necessary to compensate for said positional error, whereby contiguous portions of said pattern begin from a uniform line on said target surface.]

10. A method according to claim [8] 7 wherein:

said deflecting is imparted by said single acousto-optic deflector the extent of deflection of which is controlled by the frequency of said ramped control signal, said control signal being repetitively ramped through a range of frequencies, and further comprising:

controlling the supply of said stored pattern information for modulating each beam in accordance with data clock timing signals derived in response to the rate of change of frequency of said ramped control signal.

[11. A system for generating integrated circuit or other patterns on a target surface having photosensitive material thereon, said target surface being located on a movable support, comprising:

means for producing a plurality of laser beams for exposing said photosensitive material, said laser beams being aligned to propagate in the same direction towards said target surface and to impinge thereon in noninterfering mutually closely spaced relationship;

deflecting means for repetitively angularly deflecting said plurality of laser beams through a controlled angular range;

modulating means for concurrently modulating said laser beams during said deflection with information relating to a portion of said pattern, thereby to expose a corresponding region of said target surface to said portion of said pattern;

positioning means for moving said support; and control means, coordinating operation of said deflecting, modulating and positioning means, for moving said support and enabling said modulation to expose contiguous regions of said target surface to correspondingly contiguous portions of said pattern during sequential deflections of said plural beams.]

12. [A system according to claim 11] *A system for generating integrated circuit or other patterns on a target surface having photosensitive material thereon, said target surface being located on a movable support, comprising:*

*means for producing a plurality of laser beams for exposing said photosensitive material, said laser beams being aligned to propagate in substantially the same direction towards said target surface and to impinge thereon in noninterfering mutually closely spaced relationship;*

*deflecting means for repetitively angularly deflecting said plurality of laser beams through a controlled angular range;*

*modulating means for concurrently modulating said laser beams during said deflection with information relating to a portion of said pattern, thereby to expose a corresponding region of said target surface to said portion of said pattern;*

*positioning means for moving said support; and*

*control means, coordinating operation of said deflecting means, said modulating means and said positioning means, for moving said support and enabling said means for producing a plurality of laser beams to expose contiguous regions of said target surface to said plurality of laser beams to form on said contiguous regions of said target surface correspondingly contiguous portions of said pattern during sequential deflections of said plurality of laser beams, and* wherein said control means comprises:

first means for causing said positioning means to move said support generally continuously in a direction lateral to the direction of said angular deflection, second means for causing said deflecting means to restart said angular deflecting each time that said first means has caused said positioning means to move said support laterally through a distance substantially equal to lateral spacing between the outermost of said plurality of beams, third means for measuring the positional offset of said support along the direction of beam deflection at the time of said restart, with respect to a reference position, and fourth means for causing said modulating means to alter the time of initiation of modulation after each restart of said angular deflection by an amount established by said measured positional offset, whereby during each such angular deflection the modulation of said beams, and hence the exposure of said photosensitive material, begins from a uniform line on said target surface.

13. A system according to claim 12 wherein said control means further comprises:

fifth means, operative after said first through fourth means have caused the exposure of a first swath of said target surface, said swath consisting of a first plurality of contiguous regions extending in a direction lateral to said direction of angular deflection, for causing said positioning means to move said support in said direction of angular deflection by a distance equivalent to the length of said swath in said direction of angular deflection, and for thereafter causing said first through fourth means to expose another swath of said target surface contiguous to said first swath.

14. A control system for a laser pattern generator comprising:

first means for repetitively sweeping a plurality of noninterfering, coaligned, mutually closely spaced modulated laser beams through a certain distance along a first direction on the surface of a target, second means for moving the target in a direction lateral to said first direction through a distance corresponding to the overall width of said plural beams in the time taken to complete each sweep, and for starting the next sequential sweep when said lateral movement is completed, third means for measuring the extent of positional offset of said target in the direction of said sweep introduced during said lateral movement, and modulation initiation means for advancing or delaying the initiation of modulation of said plural beams with pattern data by an amount corresponding to said measured positional offset, wherein contiguous sections of the pattern being generated begin along a uniform reference line on said target surface.

15. A control system according to claim 14 further comprising:

modulation timing means, operative upon initiation of modulation, for thereafter providing pattern data for modulating said beams solely in response to data clock timing pulses derived from a ramp source signal used by said first means to control said sweeping.

16. A control system according to claim 14 wherein said first means comprises:

an acousto-optic deflector for simultaneously deflecting all of said beams through an angle determined by the frequency of a drive signal supplied thereto, buffer means for storing pattern data to be used for modulating each beam during said sweep, data clock means, responsive to the drive signal to said deflector, for supplying data clock timing pulses derived from said drive signal and beginning when the frequency of said drive signal reaches a specific value, and data accessing means for accessing beam modulation pattern data from said buffer means in response to said data clock timing pulses.

17. A laser pattern generator according to claim 16 wherein:

said third means measures said extent of positional offset in effective distance units corresponding to the sweep distance effectuated between consecutive data clock timing pulses, and comparator means for comparing the cumulative number of data clock timing pulses to occur during a sweep with said measured offset, and wherein said initiation means initiates modulation in response to occurrence of said coincidence.

18. A control system according to claim 16 wherein said data clock means comprises:

a delay line to which said drive signal is supplied, and balanced mixer means for comparing the frequency of the output of said delay line with the frequency of said drive signal and for providing output pulses indicative of the difference therebetween, said output pulses constituting said data clock timing pulses.

19. A control system according to claim 14 wherein said first means comprises:

an acousto-optic deflector for simultaneously deflecting all of said beams through an angle determined by the frequency of a drive signal supplied thereto, sweeping frequency synthesizer means for providing a drive signal to said acousto-optic deflector which in time sweeps linearly over a range of frequencies, together with, modulation timing means, operative upon initiation of modulation, for thereafter providing pattern data for modulating said beams at a fixed data clock rate.

20. In a laser pattern generator in which one or more coaligned laser beams are used to expose a pattern onto a target surface, said beams being modulated with pattern data to form said pattern, the improvement comprising:

deflector means for deflecting all of said beams through an angle determined by the frequency of a drive signal supplied thereto, a voltage controlled oscillator ramped to produce an output which sweeps repetitively over a controlled range of frequencies, said output being supplied to said deflector means as the drive signal therefor, and data clock means for deriving from said oscillator output a data clock signal for enabling the supply of pattern data for beam modulation during said beam deflection.

21. A laser pattern generator according to claim 20 further comprising:

reference signal means for deriving from said oscillator output a reference signal when the frequency of said output equals a certain frequency corresponding to a deflection angle, imparted by said deflector means, at which modulation of said beams with pattern data is to begin in the absence of positional error of said target surface in the direction of beam deflection.

22. A laser pattern generator according to claim 20 wherein said data clock signal comprises timing pulses each corresponding to a certain increment of angular deflection imparted by said deflector means, and further comprising:

reference signal means for deriving from said oscillator output a data start signal when the frequency of said output equals a certain frequency corresponding to a deflection angle, imparted by said deflector means, a fixed number of data clock signal pulses after which modulation of said beams with pattern data is to begin in the absence of positional error of said target surface in the direction of beam deflection.

23. A laser pattern generator according to claims 21 further comprising:

position determining means for measuring the positional error of said target surface in the direction of beam deflection with respect to a reference position, and means, responsive to said reference signal and to said data clock signal, for altering the initiation of beam modulation with said pattern data by a duration of time corresponding to that required to deflect said beams through a distance on said target surface equal to said measured positional error.

24. A laser pattern generator according to claim 20 wherein said data clock means comprises:

a delay line, said voltage controlled output being supplied to said delay line, and balanced mixer means, connected both to said delay line and to said voltage controlled oscillator, for providing data clock signal pulses in response to the difference in frequency between said undelayed output from said oscillator and the oscillator output as delayed by said delay line, whereby when the frequency of said oscillator output changes uniformly with time, said data clock signal pulses will be uniformly spaced in time, and wherein if said oscillator output changes frequency nonuniformly with time said data clock signal pulses will be correspondingly nonuniformly spaced in time.

25. A laser pattern generator according to claim 24 wherein said pattern data for modulating each beam is stored in a storage device, and further comprising:

individual means, associated with each beam, for accessing pattern data for modulating the corresponding beam from the associated storage device at a rate established by said clock data signal pulses.

26. A laser pattern generator according to claim 20 wherein plural coaligned laser beams are arrayed with each adjacent pair of beams having a spacing in the direction perpendicular to beam deflection which is less than the spacing at which interference between said pair of beams would occur, but being spaced apart in the direction of beam deflection by a sufficient offset distance so that such interference does not occur, and individual beam delay means, cooperating with said data clock means, for delaying the supply of modulating pattern data to individual beams by an amount corresponding to the offset distance of that beam in the direction of deflection.

27. A laser pattern generator in which plural coaligned laser [means] *beams* are used to expose a pattern onto a target surface, said beams being modulated with pattern data to form said pattern, the improvement comprising:

deflector means for deflecting all of said beams through an angle determined by the frequency of a drive signal supplied thereto, said plural coaligned laser beams being arrayed with each adjacent pair of beams having a spacing in the direction perpendicular to beam deflection which is less than the spacing at which interference between said pair of beams would occur, but being spaced apart in the direction of beam deflection by a sufficient offset distance so that such interference does not occur, and individual beam delay means for delaying the supply of modulating pattern data to individual beams by an amount corresponding to the offset distance of that beam in the direction of deflection,

*wherein said drive signal is repetitively swept through a range of frequencies so as to deflect said beams through a corresponding angular range, and further comprising data clock means for deriving, from said drive signal, timing pulses having an occurrence rate established by the rate of change of frequency of said drive signal, said modulating pattern data being supplied at a rate established by said clock timing pulses.*

[28. A laser pattern generator according to claim 27 wherein said drive signal is repetitively swept through a range of frequencies so as to deflect said beams through a corresponding angular range, and further comprising:

data clock means for deriving, from said drive signal, timing pulses having an occurrence rate established by the rate of change of frequency of said drive signal, said modulating pattern data being supplied at a rate established by said data clock timing pulses.]

29. A system for generating integrated circuit or other patterns on a target surface having photosensitive material thereon, said target surface being located on a movable supoport, comprising:

means for producing a plurality of laser beams for exposing said photosensitive material, said laser beams being aligned to propagate in the same direction towards said target surface and to impinge thereon in noninterfering mutually closely spaced relationship, deflecting means for repetitively angularly deflecting said plurality of laser beams through a controlled angular range, modulating means for concurrently modulating said laser beams during said deflection with information relating to a portion of said pattern, thereby to expose a corresponding region of said target surface to said portion of said pattern;

positioning means for moving said support; and control means, coordinating operation of said deflecting, modulating and positioning means, for moving said support and enabling said modulation to expose contiguous regions of said target surface to correspondingly contiguous portions of said pattern during sequential deflections of said plural beams, said control means including:

a first means for sensing the position of said support along the direction perpendicular to the angular deflection of said laser beams, said first means providing a signal to said deflecting means to initiate an angular deflection of said laser beams when said support is appropriately positioned in said perpendicular direction for exposure of a portion of said pattern, and a second means for sensing the position of said support along the direction parallel to the angular deflection of said laser beams, said second means providing a signal indicative of the position of said support along said parallel direction, said signal causing modulation data representative of said portion of said pattern to be supplied to said modulating means when the angular deflection of said laser beams reaches a reference position so that contiguous regions of sensitive material are selectively exposed beginning along a common reference line.

30. A system according to claim 29 wherein said laser beams at said target surface have diameters larger than the separation of adjacent laser beams in the direction perpendicular to said angular deflection, said laser beams being separated along the direction of said angular deflection from adjacent beams so that said beams do not overlap one another, whereby, during a single deflection, a block of photosensitive material on said target surface is entirely selectively exposed without interference between adjacent beams.

31. A system according to claim 29 wherein said modulating means comprises an acousto-optic modulator means placed within the path of each said laser beam.

32. A system according to claim 29 wherein said deflecting means comprises:

a scanned frequency acousto-optic deflector, a means for repetitively generating an electrical signal whose frequency scans a range of frequencies, an acousto-optic material transmissive to said laser beams positioned so that said laser beams propagate through said material; and at least one acousto-optic driving means, coupled to said acousto-optic material and to said generating means, for generating acoustic waves in said acousto-optic material in response to said generated electrical signals.

33. A system according to claim 32 wherein at least one acousto-optic driving means comprises an array of piezo-electric transducers, said system further comprising:

a variable time delay means for selectively delaying the electrical signal from said generating means to each said transducer, said variable time delay means being operatively connected between said generating means and said piezo-electric transducers, said variable time delay means variably delaying said electrical signals over a frequency scan of said generating means so that the wavefronts of the acoustic waves generated in said acousto-optic material are at approximately the Bragg angle with respect to the laser beams propagating through said acousto-optic material over the range of frequencies of said scan.

[34. A modulation data buffer system for use in a laser pattern generator in which a laser beam is modulated as it sweeps linearly across a target surface, the time for said beam to sweep from one pattern element position to the next adjacent position being t, comprising:

a source of clock pulses at a rate n/t where n is a small integer, a buffer memory means for storing the modulation data for a plurality of consecutive pattern element positions, buffer address counter means for addressing and reading out from said memory means the modulation data for said consecutive positions at a rate t for delivery to said modulator, said counter means being incremented by increment pulses applied thereto, and data initiation means for beginning the supply of said increment pulses to said counter means when said laser beam passes a reference location on said target surface, increment pulses thereafter being supplied to said counter means at each nth clock pulse occurrence from said source.]

[35. A system according to claim 34 wherein said data initiation means comprises:

comparator means for comparing the actual position of said target surface with respect to a desired position in the beam sweep direction and for providing a signal indicative of the extent of offset of said target surface, said signal representing a number of clock pulses equal to the time required for said beam to sweep through a distance equal to said extent of target surface offset, an offset distance counter incremented by said clock pulses from said source, said counter being started when said beam reaches a certain position which would correspond to said reference location if said target surface were not offset, and gate means for initiating the supply of increment pulses to said address counter means when the count of said offset distance counter corresponds to the number represented by said signal from said comparator means.]

[36. A method for controlling the delivery of modulation data to a laser pattern generator of the type in which at least one laser beam is swept over a target surface at a uniform linear sweep rate, comprising:

providing a data clock signal at an integral multiple n of the rate at which modulation data for consecutive pattern elements must be delivered to each beam modulator, initiating the delivery of modulation data to said beam modulator upon occurrence of the next data clock signal which occurs after said at least one laser beam sweeps past a reference position on said target surface, and thereafter;

timing the flow of modulation data to each beam modulator at each nth data clock signal.]

[37. The method of claim 36 wherein said laser pattern generator includes an array of plural beams in which array the individual beams are offset from a reference position by different amounts in the sweep direction, and which includes;

delaying the modulation data to each beam modulator by a duration of time corresponding to that required to sweep the beam through a distance equal to the offset of that beam in said array, said delay being carried out by shifting said modulation data in a shift register that is clocked by a selectable subset of each nth data clock signal.]

[38. A system for introducing a selectable delay into the path of pattern data being supplied to an optical beam modulator in a laser pattern generator, comprising:

a shift register having an input to which said pattern data is serially supplied and having a plurality of positions from any of which the shifted data can be outputted, said shift register being shifted in response to clock pulses applied to a clock pulse input thereof, phased data clock generator means for providing plural data clock pulse trains, the clock pulses in each of said trains occurring at uniformly spaced time intervals corresponding to the requisite data delivery rate to said optical beam modulator, the pulses in said plural trains being mutually separated with respect to the pulses in the other trains so as to provide a fixed but different relative phase relationship between one pulse train and each of the other pulse trains, first selector means for applying a selected one of said clock pulse trains to said shift register clock pulse input, and second selector means for delivering the shifted data outputted from a selected one of said shift register positions to said optical beam modulator.]

[39. A selectable data delay system according to claim 38 wherein said data clock generator means provides four data clock pulse trains having relative phase relationships of 0 degrees, 90 degrees, 180 degrees and 270 degrees, and wherein said uniformly spaced time intervals correspond to the time that a laser beam in said laser pattern generator takes to sweep from one pattern element position to the adjacent pattern element position on a target surface, clock pulse train selection by said first selector means thereby introducing a selectable delay corresponding to zero, one-quarter, one-half or three-quarters of the distance between adjacent pattern element positions on said target surface.]

[40. A selectable data delay system according to claim 38 wherein said uniformly spaced time intervals correspond to the time to that a laser beam in said laser pattern generator takes to sweep from one pattern element position to the adjacent pattern element position on a target surface, together with;

a clock pulse source providing clock pulses at intervals of t/n, where n is a small integer and is equal to the plurality of the data clock pulse trains provided by said phased data clock generator means, and data initiation means for initiating the supply of pattern data to said shift register upon occurrence of a certain reference pulse synchronized with one of said clock pulses from said source, consecutive pattern data thereafter being supplied to said shift register at time intervals of t, said phased data clock generator means being gated so as to initiate provision of said plural pulse trains upon occurrence of said certain reference pulse, said generator means being synchronized with said source so that the data clock pulses in each train occur in synchronism with each nth clock pulse from said source.]

[41. A plurality of selectable data delay systems each according to claim 38 and employed in a laser pattern generator having a like plurality of individually modulated laser beams that are concurrently swept across a target surface at a uniform sweep rate, said beams being arranged in a matrix with individual beams mutually offset with respect to one another in the sweep direction, pattern data being individually supplied to a separate modulator for each beam via a respective one of said selectable data delay systems, the combination of pulse train selected by said first selector means and shift register position selected for data output by said second selector means being different for each of said data delay systems and being selected so that the delay introduced thereby corresponds to the extent of offset of the corresponding beam within said array.]

[42. The apparatus of claim 41 wherein all of said data delay systems use a common phased data clock generator means.]

43. In a laser pattern generator in which one or more coaligned laser beams are used to expose a pattern onto a target surface, said beams being modulated with pattern data to form said pattern, the improvement comprising:

deflector means for deflecting all of said beams repetitively across said target surface at a constant rate;

data clock means producing data clock pulses for enabling the supply of pattern data at a uniform data rate for modulation during said beam deflection;

time counting means, initiated at a fixed time with respect to the beginning of the deflection of said beam in the absence of positional error of said target surface in the direction of beam deflection, for counting a fixed number of data clock pulses and, upon the completion of said counting, for producing a signal to permit said data clock pulses to enable the supply of pattern data for beam modulation; and correcting means for measuring positional error of said target surface in the direction of beam deflection and for varying, in response to said measured positional error, the number of data clock pulses counted by said time counting means before said time counting means produces a signal to permit said data clock pulses to enable the supply of pattern data for beam modulation, so that said pattern data is exposed on said target surface at a predetermined location regardless of any positional error of the target surface in the direction of beam deflection.

*44. A laser pattern generating system for providing a pattern on a target comprising:*

*laser means for causing a plurality of laser beams to impinge on the surface of a target and to trace paths on a first portion of said surface, said paths extending in a first direction;*

*means for modulating said laser beams so that said laser beams form a pattern in said first portion;*

*means for moving said target in a second direction lateral to said first direction, said laser means causing said laser beams to trace paths along said first direction on a second portion of said target after said target is moved in said second direction;*

*means for providing a measure of any offset in the position of said target along said first direction occurring during movement of said target in said second direction; and*

*means for causing said modulation means to alter the timing of modulation of said laser beams in response to said measure so that the pattern formed in said second portion of said surface by said laser beams is aligned with the pattern in said first portion.*

*45. A system for providing a pattern on a target in which a laser beam is modulated by a modulator as said laser beam sweeps across a target surface in a Y direction, said system comprising:*

*memory means for storing the modulation data for a plurality of consecutive pattern element positions;*

*address counter means for addressing and reading out from said memory means the modulation data for said consecutive positions for delivery to said modula-*

*tor, said address counter means being incremented by increment pulses applied thereto;*

*means for moving said target in an X direction lateral to said Y direction;*

*means for providing a measure of any deviation in the position of said target along said Y direction occurring during motion of said target in said X direction; and*

*data initiation means for determining when said target has moved to a predetermined position along said X direction and for beginning the supply of increment pulses to said counter in response to said target reaching said predetermined position and in response to said measure.*

*46. A method for providing a pattern on a target comprising the steps of:*

*causing a plurality of laser beams to impinge on the surface of said target and to trace paths on a first portion of said target, said paths extending in a first direction;*

*modulating said laser beams so that said laser beams form a pattern in said first portion;*

*moving said target in a second direction perpendicular to said first direction so that said laser beams impinge on and trace paths along said first direction on a second portion of said target;*

*providing a measure of any offset in the position of said target along the first direction occurring during movement of said target in the second direction; and*

*altering the timing of modulation of said laser beams in response to said measure so that the pattern formed in said second portion of said surface by said laser beams is aligned with the pattern in the first portion.*

* * * * *